(12) United States Patent
Ogawa

(10) Patent No.: US 6,310,491 B1
(45) Date of Patent: Oct. 30, 2001

(54) SEQUENTIAL LOGIC CIRCUIT WITH ACTIVE AND SLEEP MODES

(75) Inventor: Tadahiko Ogawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/411,834

(22) Filed: Oct. 4, 1999

(30) Foreign Application Priority Data

Oct. 2, 1998 (JP) .................................................. 10-280767

(51) Int. Cl.$^7$ ................................................. H03K 19/173
(52) U.S. Cl. .............................. 326/46; 326/113; 327/185
(58) Field of Search ................................. 326/46, 113, 93; 327/185

(56) References Cited

U.S. PATENT DOCUMENTS

| | | | |
|---|---|---|---|
| 3,943,378 | * | 3/1976 | Beutler .................................. 377/117 |
| 4,145,761 | | 3/1979 | Gunter et al. . |
| 5,003,201 | * | 3/1991 | Bai . |
| 5,528,177 | * | 6/1996 | Sridhar et al. ........................ 326/113 |
| 5,712,826 | | 1/1998 | Wong et al. . |
| 5,760,608 | * | 6/1998 | Naffziger et al. ...................... 326/86 |
| 5,784,384 | | 7/1998 | Maeno . |
| 5,796,624 | * | 8/1998 | Sridhar et al. .......................... 703/14 |
| 6,028,474 | * | 2/2000 | Ito ........................................ 327/544 |
| 6,043,686 | * | 3/2000 | Hashimoto et al. .................... 327/73 |
| 6,117,816 | * | 1/2001 | Nagata ................................... 327/77 |

FOREIGN PATENT DOCUMENTS

| | | |
|---|---|---|
| 62-67617 | 3/1987 | (JP) . |
| 7-271477 | 10/1995 | (JP) . |

* cited by examiner

Primary Examiner—Michael Tokar
Assistant Examiner—Daniel D. Chang
(74) Attorney, Agent, or Firm—Young & Thompson

(57) ABSTRACT

A sequential logic circuit having active and sleep modes prevents stored information from being lost immediately after the transition from a sleep mode to an active mode. This sequential logic circuit includes a latch circuit having an input terminal to which an input signal is applied, an output terminal from which and output signal is derived, and a set and/or reset terminal to which a set and/or reset signal is applied. The latch circuit has an active mode where a latch function is operable and a sleep mode where the latch function is inoperable, one of which is alternatively selected. The output signal is set or reset to have a specific logic state by the set or reset signal having a specific logic level applied to the set or reset terminal in the active mode. The sequential logic circuit further includes circuitry for preventing the set or reset signal from being applied to the set or reset terminal in the sleep mode, thereby avoiding loss of information or data latched in the latch circuit prior to transition to the sleep mode from the active mode. Thus, the information-latch operation in both of the modes is ensured.

12 Claims, 13 Drawing Sheets

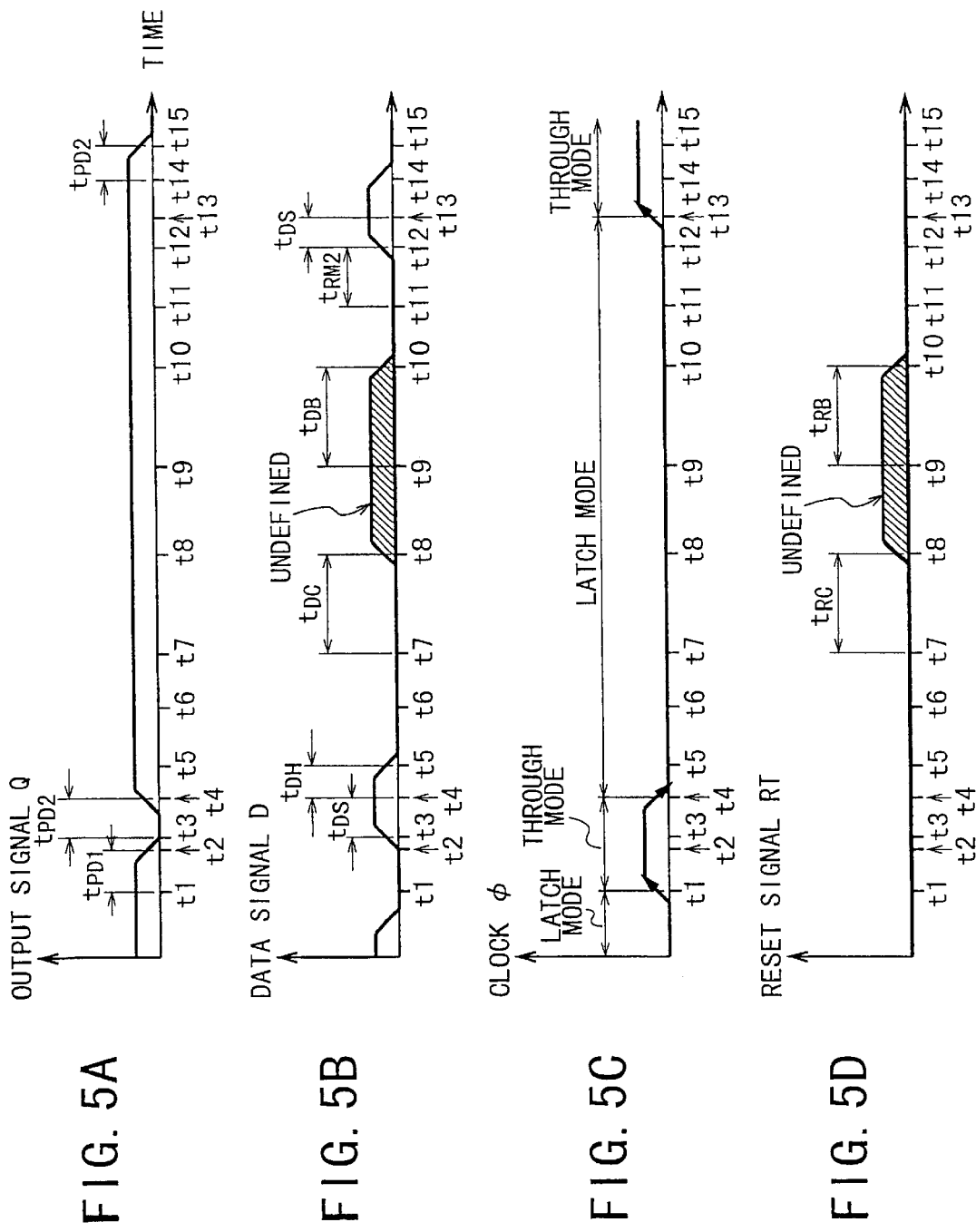

SEQUENTIAL LOGIC CIRCUIT WITH ACTIVE AND SLEEP MODES

BACKGROUND OF THE INVENTION

1. Field of the Invention

The present invention relates to a sequential logic circuit and more particularly, to a sequential logic circuit equipped with a latch circuit having active and sleep modes.

2. Description of the Prior Art

In recent years, semiconductor integrated logic devices have been designed to cope with both high-speed operation in the active mode and low power-dissipation in the sleep mode. The "active mode" is the state where the normal operation of the logic devices are performed. The "sleep mode" is the state where the normal operation of the logic devices are stopped. The "sleep mode" may be termed the "power-down mode" because of its purpose of reducing the power dissipation. It is important for the semiconductor integrated logic devices of this sort to prevent the stored information in the devices from being broken especially in the sleep mode.

An example of the prior-art semiconductor integrated logic devices of this sort is disclosed in the Japanese Non-Examined Patent Publication No. 7-271477 published in October 1995. This semiconductor integrated logic device, which is shown in FIG. 15 of this Publication, is formed by Metal-oxide-semiconductor Field-Effect Transistors (MOSFETs) whose threshold voltage is low (i.e., low-threshold MOSFETs) and is operated at a low power supply voltage.

MOSFETs having the low threshold voltage have a characteristic that the subthreshold current (i.e., current leakage) flowing between the source and drain during the OFF state is comparatively large. Therefore, an upper-side power supply and a lower-side power supply are connected to the logic circuits through MOSFETs whose threshold voltage is high (i.e., high-threshold MOSFETs). This is because high-threshold MOSFETs have low current leakage during the OFF state. Moreover, a bistable circuit formed by high-threshold MOSFETs is added to the logic circuit. The bistable circuit is directly supplied with a power supply. Thus, the subthreshold leakage current is prevented in the sleep mode and at the same time, the information stored in the logic circuit is prevented from being broken or lost.

Furthermore, with the prior-art semiconductor integrated logic device, when the sleep mode is finished, the logic device is supplied with the upper- and lower-side power supplies again and then, the instruction for holding the clock signal is canceled. At the start of the sleep mode, the clock signal is shifted to its holding state and then, the logic circuit is shifted from the active mode to the sleep mode.

Next, the above-described prior-art semiconductor integrated logic device disclosed in the Japanese Non-Examined Patent Publication No. 7-271477 is explained in detail with reference to FIG. 1.

As shown in FIG. 1, this prior-art logic circuit is comprised of a latch circuit FF102 having set and reset functions. The latch circuit FF102 includes two transmission gates TM1 and TM2, three inverters INV101, INV102, and INV103, and a NOR gate NOR101.

The inverter INV101 has a p-channel MOSFET having a low threshold voltage (i.e., low-threshold p-channel MOSFET) (not shown) and a low-threshold n-channel MOSFET (not shown). The gates of these two MOSFETs are coupled together to be connected to an input terminal of the inverter INV101 to which a data signal D is applied. The drains of these two MOSFETs are coupled together to be connected to an output terminal of the inverter INV101 from which an output signal D1 is derived. The source of the p-channel MOSFET is connected to an upper-side power supply of $V_{DD}$ through a high-threshold p-channel control MOSFET HP101. The source of the n-channel MOSFET is connected to a lower-side power supply (i.e., the ground potential GND) through a high-threshold n-channel control MOSFET HN101. The output signal D1 of the inverter INV101 is applied to a bidirectional terminal of the transmission gate TM101. Thus, the inverter INV101 is formed by the low-threshold MOSFETs and therefore, it is capable of high-speed operation.

The high-threshold MOSFET HP101 serves to connect the inverter 101 to the upper-side power supply of $V_{DD}$ or disconnect the inverter 101 therefrom in response to a sleep mode signal SL. Similarly, the high-threshold MOSFET HN101 serves to connect the inverter 101 to the ground GND or disconnect the inverter 101 therefrom in response to an inverted sleep mode signal SLB. The signal SLB has an inverted value to that of the signal SL.

To enter the sleep mode, the sleep mode signal SL is in the logic high (H) level (i.e., SL=1) and the inverted sleep mode signal SLB is in the logic low (L) level (i.e., SLB=0). At this stage, the control transistors HP101 and HN101 are turned off, blocking the supply of the supply voltage $V_{DD}$ and the ground potential GND to the inverter INV101. Since the control transistors HP101 and HN101 have the high threshold voltages, they have small subthreshold leakage currents, which decreases the power consumption in the sleep mode.

The transmission gate TM101 has a low-threshold p-channel MOSFET (not shown) and a low-threshold n-channel MOSFET (not shown). The drain and source of the p-channel MOSFET are connected to the source and drain of the n-channel MOSFET, respectively. The gate of the n-channel MOSFET is applied with a clock signal $\phi$. The gate of the p-channel MOSFET is applied with an inverted clock signal $*\phi$. The signal $*\phi$ has an inverted value to that of the signal $\phi$. One of the bidirectional terminals of the transmission gate TM101 is connected to the output terminal of the inverter INV101 and the other is connected to a second input terminal of the NOR gate NOR101.

As described above, the NOR gate NOR101 is formed by the low-threshold MOSFETs and therefore, it is capable of high-speed operation.

The NOR gate NOR101 has first and second low-threshold p-channel MOSFETs (not shown) and first and second low-threshold n-channel MOSFETs (not shown). The first and second -channel MOSFETs are connected in series to form two terminals, one of which is applied with the power supply voltage $V_{DD}$ and the other is connected to an output terminal of the NOR gate NOR101. The gate of the first p-channel MOSFET, which is connected to a first input terminal of the gate NOR101, is applied with a reset signal RT. The gate of the second p-channel MOSFET, which is connected to the second input terminal of the gate NOR101, is applied with the output signal D2 from the transmission gate TM101. The first and second n-channel MOSFETs are connected in parallel to form two terminals, one of which is connected to the ground GND and the other is connected to the output terminal of the NOR gate NOR101. The gate of the first n-channel MOSFET, which is connected to the first input terminal of the gate NOR101, is applied with the reset signal RT. The gate of the second n-channel MOSFET, which is connected to the second input terminal of the gate NOR101, is applied with the output signal D2 from the transmission gate TM101.

The output signal D3 of the NOR gate NOR101, which is the result of the NOR operation between the signal D2 and the reset signal RT, is outputted as an output signal Q from an output terminal of the latch circuit FF102 to a next-stage circuitry (not shown). At the same time as this, the signal D3 is further applied to the inverter INV102.

Since the NOR gate NOR101 is formed by the low-threshold MOSFETs, it is capable of high-speed operation.

The NOR gate NOR101 is supplied with the upper-side power supply of $V_{DD}$ through a high-threshold p-channel control MOSFET HP102 and with the ground potential GND through a high-threshold n-channel control MOSFET HN102. The high-threshold MOSFET HP102 serves to connect the gate NOR101 to the power supply of $V_{DD}$ or disconnect the inverter 101 therefrom in response to the sleep mode signal SL. Similarly, the high-threshold MOSFET HN102 serves to connect the gate NOR101 to the ground GND or disconnect the gate NOR101 therefrom in response to the inverted sleep mode signal SLB.

In the sleep mode where the signal SL is in the logic H level (i.e., SL=1) and the inverted sleep mode signal SLB is in the logic L level (i.e., SLB=0), the control transistors HP102 and HN102 are turned off, blocking the supply of the supply voltage $V_{DD}$ and the ground potential GND to the NOR gate NOR101. Since the control transistors HP102 and HN102 have the high threshold voltages, they have small subthreshold leakage currents, which decrease the power consumption.

The inverter INV102 has a high-threshold p-channel MOSFET (not shown) and a high-threshold n-channel MOSFET (not shown). The gates of these two MOSFETs are coupled together to be connected to the output terminal of the latch circuit FF102 from which the output signal Q is derived. Therefore, these gates are applied with the signal Q. The drains of these two MOSFETs are coupled together to be connected to an output terminal of the inverter INV102 from which an output signal D4 is derived. The source of the p-channel MOSFET is connected to the power supply of $V_{DD}$. The source of the n-channel MOSFET is connected to the ground potential GND. The output signal D4 of the inverter INV102 is applied to a bidirectional terminal of the transmission gate TM102. Thus, the inverter INV102 is formed by the high-threshold MOSFETs and therefore, it is capable of decreasing the power consumption in the sleep mode.

To distinguish the inverter INV102 comprising the high-threshold MOSFETs from the inverter INV101 comprising the low-threshold MOSFETs, hatching is added to the symbol of the inverter INV102 in FIG. 1.

The transmission gate TM102 has a low-threshold p-channel MOSFET (not shown) and a low-threshold n-channel MOSFET (not shown). The gate TM102 has the same configuration as that of the transmission gate TM101 except that the gate of the n-channel MOSFET is applied with the inverted clock signal *ϕ and the gate of the p-channel MOSFET is applied with the clock signal ϕ. One of the bidirectional terminals of the transmission gate TM102 is connected to the output terminal of the inverter INV102 and the other is connected to the second input terminal of the NOR gate NOR101.

As described above, the NOR gate NOR102 is formed by the low-threshold MOSFETs and therefore, it is capable of high-speed operation.

To control the information-storing or latch function of the latch circuit FF102, the latch circuit FF102 includes an inverter INV103 connected in parallel to the NOR gate NOR101. The inverter INV103 has the same configuration as that of the inverter INV102. The inverter INV103 is also formed by high-threshold MOSFETs and therefore, it is capable of decreasing the power consumption in the sleep mode. To distinguish the inverter INV103 from the inverter INV101, hatching is added to the symbol of the inverter INV103 in FIG. 1.

Next, the operation of the latch circuit FF102 having the above-described configuration is explained below with reference to FIGS. 2A to 2E.

The latch circuit FF102 enters the active mode when the sleep mode signal SL is in the logic L level (i.e., SL=0) and the inverted sleep mode signal SLB is in the logic H level (i.e., SLB=1). In this mode, the control transistors HP101, HN101, HP102, and HN102 are turned on, allowing the supply voltage $V_{DD}$ and the ground potential GND to be supplied to the inverter INV101 and the NOR gate NOR101. Therefore, the inverter INV101 is capable of its inverting operation with respect to the data signal D, and the gate NOR101 is capable of its NOR operation with respect to the output signal D2 of the transmission gate TM101.

When the reset signal RT is in the logic L level (i.e., RT=0), the latch circuit FF102 is not reset and capable of its high-speed latch operation. In this state, the output signal D1 of the inverter INV101 is introduced by the opened transmission gate TM101 at the time t1 when the pulse of the clock signal ϕ is rising (i.e., the pulse of the inverted clock signal *ϕ is falling) and then, the signal D1 is transmitted to the NOR gate NOR101 and the inverter INV103. At this time t1, as shown in FIG. 2C, the clock signal ϕ is turned from the latch mode to the through mode. After a latch release time tPD1 is passed (see FIG. 2A), the inverter INV103 outputs the output signal D3' as the output signal Q of the latch circuit FF102 at the time t2.

At this stage, the transmission gate TM102 is closed at the time t1 by the inverted clock signal *ϕ. Therefore, the output signal D2 of the inverter INV101 and the output signal D4 of the inverter INV102 do not become competitive.

If the logic state of the data signal D is inverted at the time t3 during the through mode of the clock signal ϕ, as shown in FIG. 2B, the inversion of the signal D appears in the output signal Q at the time t4 delayed by a propagation delay time tPD2 with respect to the time t3, as shown in FIG. 2A. To ensure the normal operation of the latch circuit FF2, the inversion of the signal D is possible under the condition that the inversion time t3 of the clock signal ϕ is prior to the inversion time t4 of the data signal D by at least a set-up time tDS. Also, the inverted data signal D needs to be held by the time t5 delayed by a data hold time tDH with respect to the time t4, as shown in FIG. 2B.

Then, the data signal D introduced by the transmission gate TM101 is inputted into the inverter INV102 through the NOR gate NOR101 and the inverter INV103. Furthermore, the data signal D is introduced by the transmission gate TM102 at the time t4 and then, it is fed back to the second input terminal of the NOR gate NOR101 and the input of the inverter INV103.

At this stage, the transmission gate TM101 is closed at the time t4 and therefore, the output signal D5 of the transmission gate TM102 and the output signal D2 of the inverter INV102 do not become competitive.

If the reset signal RT in the logic H level (i.e., RT=1) is applied to the latch circuit FF102 during the active mode (i.e., SL=0 and SLB=1), the output signal Q is forced to be turned to the logic L level (i.e., Q=0) independent of the state of the clock signal φ and the inverted clock signal *φ. Thus, the reset operation of the latch circuit FF102 is carried out.

As explained above, in the active mode where the sleep mode signal SL is in the logic L level (SL=0) and the inverted sleep mode signal SLB is in the logic H level (SLB=1), the control MOSFETs HP101, HN101, HP102, and HN102 conduct are in the ON state, allowing the power supply voltage $V_{DD}$ and the ground potential GND to be supplied to the MOSFETs HP101, HN101, HP102, and HN102. This means that both the inverter INV101 and the NOR gate NOR101 are operable in the active mode. As a result, the data signal D is latched by the latch circuit FF102 according to the clock signal φ and the inverted clock signal *φ. In other words, the latch circuit FF102 has a high-speed latch operation.

Next, the operation of the latch circuit FF102 in the sleep mode is explained below with reference to FIGS. 2A to 2E.

The latch circuit FF102 enters the sleep mode when the sleep mode signal SL is in the logic H level (i.e., SL=1) and the inverted sleep mode signal SLB is in the logic L level (i.e., SLB=0). In this mode, the control transistors HP101, HN101, HP102, and HN102 are turned off, blocking the supply of the power supply voltage $V_{DD}$ and the ground potential GND to the inverter INV101 and the NOR gate NOR101. Therefore, the inverter INV101 is unable to perform its inverting operation with respect to the data signal D, and the gate NOR101 is unable to perform its NOR operation with respect to the output signal D2 of the transmission gate TM101.

The operation of the latch circuit FF102 in the sleep mode is explained in detail below.

Here, prior to the transition from the active mode (i.e., SL=0 and SLB=1) to the sleep mode (i.e., SL=1 and SLB=0), it is assumed that the clock signal φ is fixed in the logic L level (i.e., φ=0) and the inverted clock signal *φ is fixed in the logic H level (i.e., *φ=1). Also, it is assumed that the clock signal φ in the logic L level and the inverted clock signal *φ in the logic H level are kept unchanged in the sleep mode. This is to ensure the latch operation of the circuit FF102. Specifically, the inverters INV102 and INV103, which are connected to each other through the transmission gate TM102, constitute a bistable circuit. Therefore, the inputted data to the latch circuit FF102 immediately before the transition to the sleep mode can be latched by the bistable circuit.

To ensure the latch operation in the sleep mode, it is needless to say that the power supply voltage $V_{DD}$ and the ground potential GND are kept being supplied to the inverters INV102 and INV103 even in the sleep mode. Since the inverters INV102 and INV103 are formed by the high-threshold MOSFETs, current leakage is small in the sleep mode, resulting in low power consumption of the inverters INV102 and INV103. On the other hand, the supply of the power supply voltage $V_{DD}$ and the ground potential GND to the inverter INV101 and the NOR gate NOR101 is stopped and at the same time, the control MOSFETs HP101, HN101, HP102, and HN102 have the high threshold voltage. Thus, current leakage is small in the sleep mode, resulting in low power consumption of the MOSFETs HP101, HN101, HP102, and HN102.

Next, the conditions for satisfying the above-described assumption that the clock signal φ is fixed in the logic L level (i.e., φ=0) and the inverted clock signal *φ is fixed in the logic H level (i.e., *φ=1) and that the clock signal φ in the logic L level and the inverted clock signal *φ in the logic H level are kept unchanged in the sleep mode are explained below.

When the operation of the latch circuit FF102 is turned from the active mode to the sleep mode, the logic state (L or H) of the data signal D needs to be held at the time t5 subsequent to the time t4 when the circuit FF102 is turned to the latch mode by at least the data hold time tDH.

On the other hand, if the latch circuit FF102 is incorporated into a semiconductor integrated logic circuit including sequential logic circuits similar to the circuit FF102 and combinational logic circuits, the necessary time for the data hold times to be passed in all the sequential logic circuits including the latch circuit FF102 is longer than the data hold time tDH due to the different propagation delays of signals. Considering this fact, the transition from the active mode to the sleep mode needs to be performed at the time t6 after a release time tRL0 is passed from the time t5.

Additionally, at the time t7 after a data calm time tDC from the time t6, the data signal D is turned to be in a floating or undefined state. Similarly, at the time t7 after a reset calm time tRC from the time t6, the reset signal RT is also turned to be in a floating or undefined state. The floating or undefined state of the signals D and RT are held through the sleep mode. Also, to keep the stored data in the latch circuit FF102 through the sleep mode, in other words, to keep the bistable circuit formed by the inverters INV102 and INV103 active, the transmission gate TM102 needs to be kept conductive (i.e., ON). Therefore, the clock signal φ in the logic L level and the inverted clock signal *φ in the logic H level are required to be kept unchanged. Moreover, the stored value of the output signal Q of the latch circuit FF102 in the sleep mode is kept unchanged because the inverter INV103 is kept active.

Next, the transition from the sleep mode to the active mode after the sleep mode has been held for a specific period is explained below.

To return the operation of the latch circuit FF102 from the sleep mode to the active mode, the logic state of the sleep signal SL is turned from the H level to the L level at the time t8. At this stage, the logic state (L or H) of the data signal D is returned to the prior state just before entering the sleep mode at the time t10. The time t10 is delayed from the time t8 by a data recovery time tDB. Similarly, the logic state (L or H) of the reset signal RT is returned to the prior state just before entering the sleep mode at the time t10. The time t10 is delayed from the time t8 by a reset recovery time tRB.

On the other hand, as already described above, if the latch circuit FF102 is incorporated into a semiconductor integrated logic circuit including sequential logic circuits similar to the circuit FF102 and combinational logic circuits, the necessary time for the data and reset recovery times to be passed in all the sequential logic circuits including the latch circuit FF102 is longer than the data recovery time tDB and the reset recovery time tRB due to the different propagation delays of signals. Considering this fact, the transition of the data and reset signals D and RT need to be performed at the time t11 after a removal time tRM0 is passed from the time t10. Needless to say, the fact that the data signal D is shifted at the time t11 prior to the time t12 by a set-up time tDS should be considered. At the time t12, the clock signal φ is turned from the latch mode to the through mode.

With the prior-art sequential logic circuit or latch circuit FF102 shown in FIG. 1, however, there is a problem the value or information of the stored signal D is broken immediately after the transition from the sleep mode to the active mode. This problem is caused by the following reason.

As explained previously, at the time t10, which is delayed from the time t8 by the data recovery time tDB, the logic state (L or H) of the reset signal RT is returned to the prior state just before entering the sleep mode (i.e., the reset signal RT is in the logic L state, or RT=0). This is due to the different propagation delays of the signals. At the time t8, the instruction to return from the sleep mode to the active mode is performed.

Therefore, immediately after the transition instruction by the sleep signal SL at the time t8, the control MOSFETs HP101, HN101, HP102, and HN102 are in the ON state by the sleep signal SL in the logic L state (i.e., SL=0) and the inverted sleep signal SLB in the logic H state (i.e., SLB=1). Thus, the supply voltage $V_{DD}$ and the ground potential GND are supplied to the inverter INV101 and the NOR gate NOR101. This means that the inverter INV101 and the NOR gate NOR101 have been already operable immediately after the time t8.

Accordingly, the reset signal RT in the floating or undefined logic state is outputted by the NOR gate NOR101 as the output signal Q in the floating or undefined logic state. The undefined output signal Q thus produced is then sent to the inverter INV103 and the NOR gate NOR101 through the inverter INV102 and the conducting transmission gate TM102. Finally, the undefined output signal Q is fed back to the inverter INV102, breaking the stored signal or information in the inverter INV102.

SUMMARY OF THE INVENTION

Accordingly, an object of the present invention to provide a sequential logic circuit having active and sleep modes that prevents the stored information from being broken or lost immediately after the transition from a sleep mode to an active mode.

Another object of the present invention to provide a sequential logic circuit having active and sleep modes that ensures the information-latch operation in both of the modes.

The above objects together with others not specifically mentioned will become clear to those skilled in the art from the following description.

A sequential logic circuit according to the present invention is comprised of a latch circuit having an input terminal to which an input signal is applied, an output terminal from which an output signal is derived, and a set and/or reset terminal to which a set and/or reset signal is applied. The latch circuit has an active mode where a latch function is operable and a sleep mode where the latch function is inoperable, one of which is alternatively selected. The output signal is set or reset to have a specific logic state by the set or reset signal having a specific logic level applied to the set or reset terminal in the active mode.

The sequential logic circuit further includes a means for preventing the set or reset signal from being applied to the set or reset terminal in the sleep mode, thereby avoiding loss of information or data latched in the latch circuit prior to transition to the sleep mode from the active mode.

With the sequential logic circuit according to the present invention, the means for preventing the set or reset signal from being applied to the set or reset terminal in the sleep mode is provided, thereby avoiding loss of information or data latched in the latch circuit prior to transition to the sleep mode from the active mode. Therefore, the stored information or data can be prevented from being broken immediately after the transition from the sleep mode to the active mode. This means that the information-latch operation in both of the sleep and active modes is ensured.

BRIEF DESCRIPTION OF THE DRAWINGS

In order that the present invention may be readily carried into effect, it will now be described with reference to the accompanying drawings.

FIGS. 5A to 5G are timing diagrams showing the change of the individual signals used in the sequential logic circuit according to the first embodiment of FIG. 3, respectively.

DETAILED DESCRIPTION OF THE PREFERRED EMBODIMENTS

Figure 1:
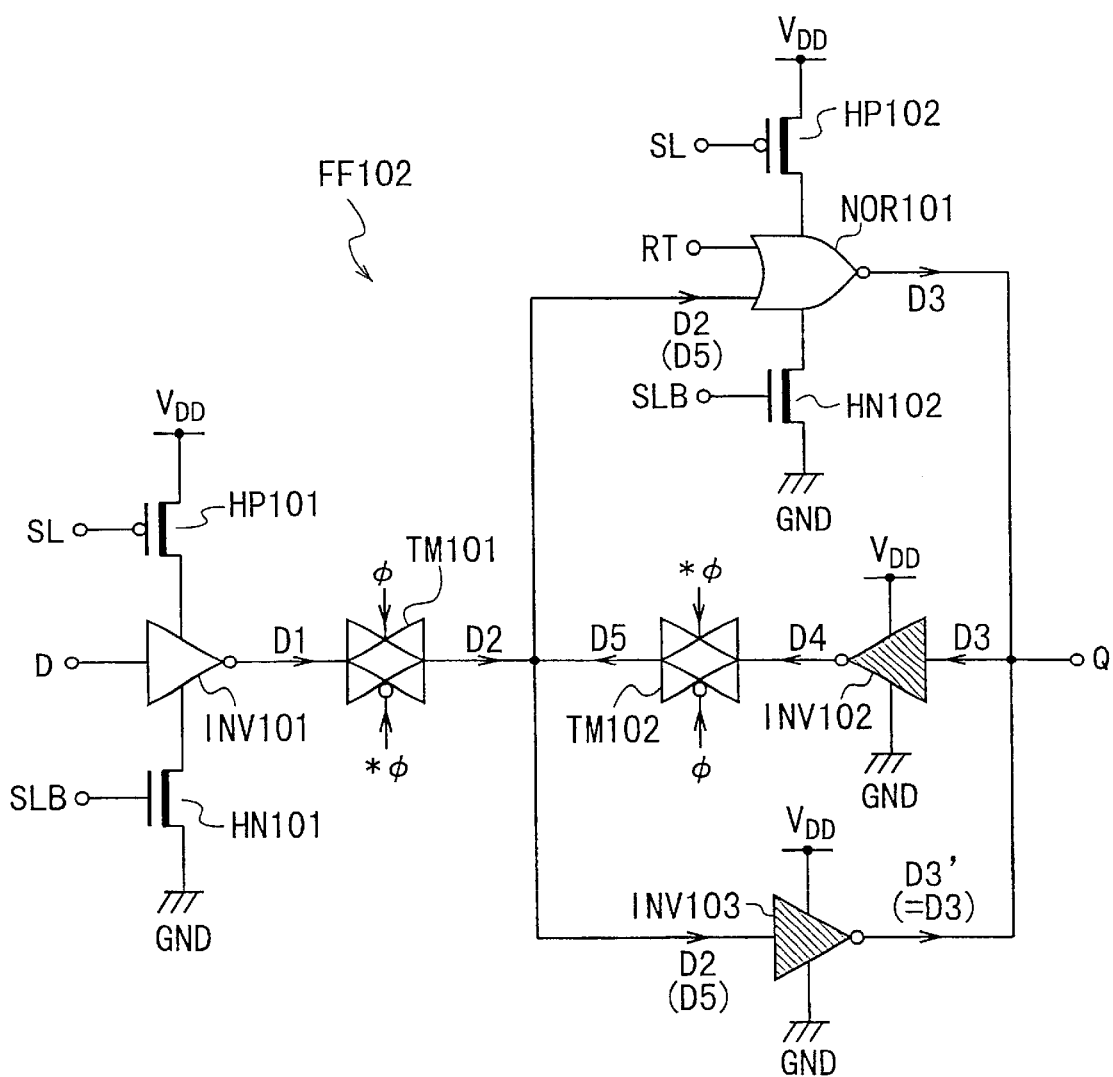
FIG. 1 is a diagram showing the circuit configuration of a prior-art sequential logic circuit having sleep and active modes.
Figures 2A, 2B, 2C, 2D:
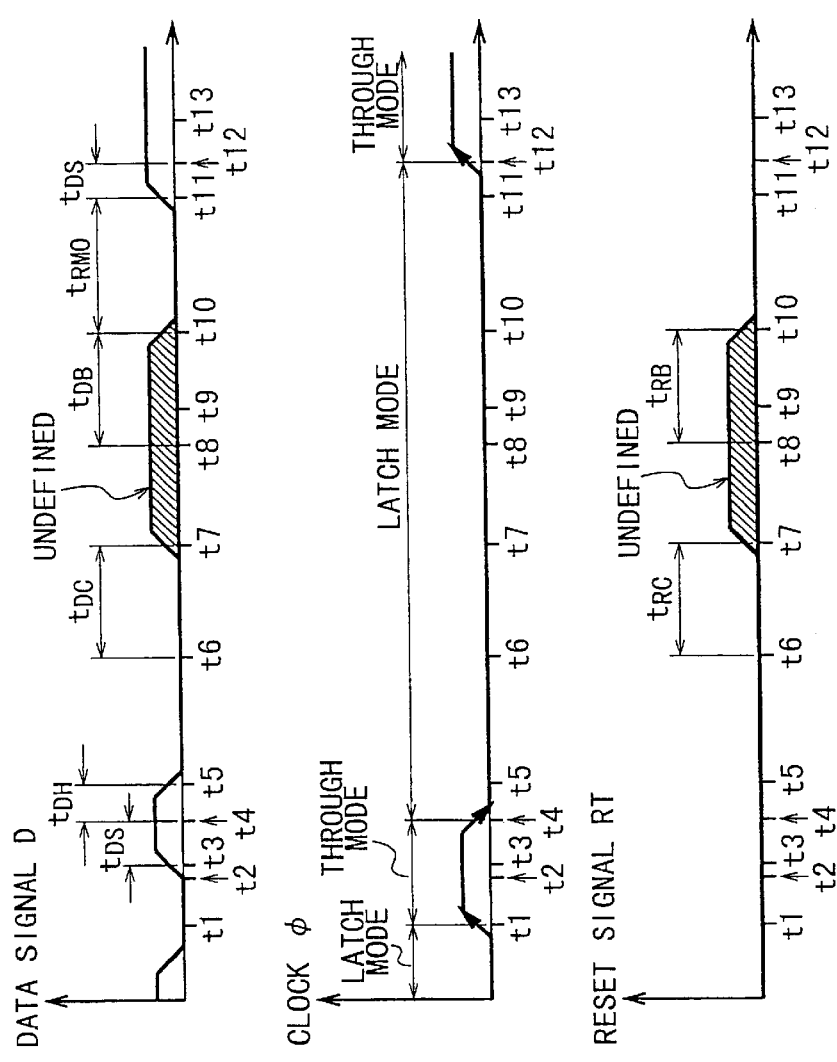
FIGS. 2A to 2E are timing diagrams showing the change of the individual signals used in the prior-art sequential logic circuit shown in FIG. 1, respectively.
Figure 2E:
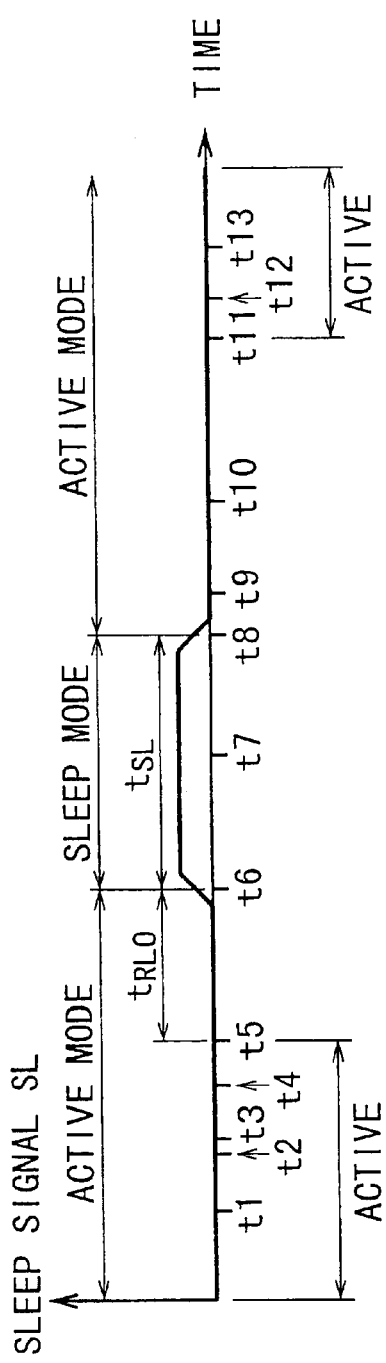

Preferred embodiments of the present invention will be described in detail below while referring to the drawings attached.

First Embodiment

Figure 3:
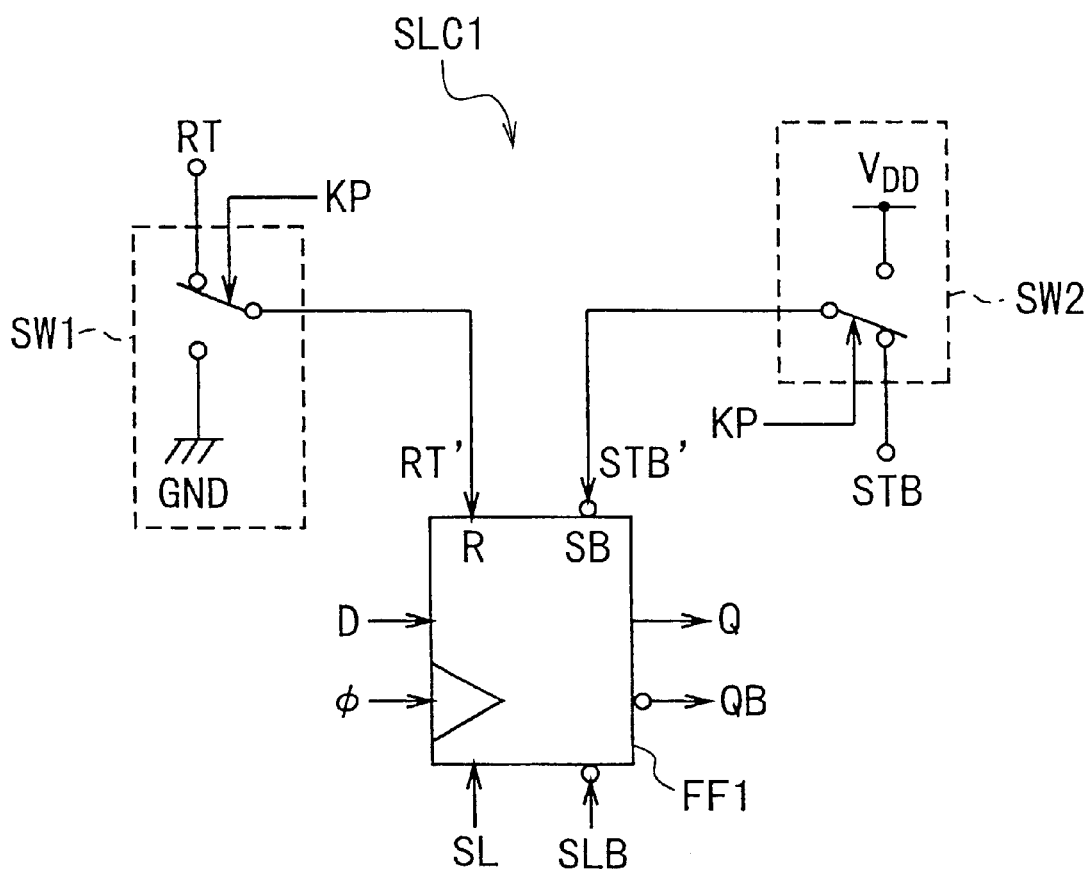
FIG. 3 is a schematic diagram showing the circuit configuration of a sequential logic circuit having sleep and active modes according to a first embodiment of the present invention.

As shown in FIG. 3, a sequential logic circuit SLC1 according to a first embodiment of the present invention is comprised of a latch circuit FF1 having set and reset functions, and first and second switches SW1 and SW2. The latch circuit FF1 has an active mode where a latch function is operable and a sleep mode where the latch function is inoperable.

In the active mode, the latch circuit FF1 performs a specified latch operation at high speed with respect to a data signal D applied to a data terminal synchronized with a clock signal φ. As the result of the latch operation, an output signal Q and an inverted output signal QB are outputted from two data terminals of the circuit FF1.

The latch circuit FF1 can be transferred to a specific reset state by a reset signal RT in a logic H level applied to a reset terminal R independent of the logic state of the clock signal φ and the data signal D. Also, the circuit FF1 can be transferred to a specific set state by an inverted set signal STB in a logic L level applied to an inverted set terminal SB independent of the logic state of the clock signal φ and the data signal D.

To transfer the latch circuit FF1 from the sleep mode to the active mode, a sleep signal SL in the logic L state (i.e., SL=0) needs to be applied to a sleep terminal and at the same time, an inverted sleep signal SLB in the logic H state (i.e., SLB=1) needs to be applied to an inverted sleep terminal. On the other hand, to transfer the latch circuit FF1 from the active mode to the sleep mode, the sleep signal SL in the logic H state (i.e., SL=1) needs to be applied to the sleep terminal end at the same time, the inverted sleep signal SLB in the logic L state (i.e., SLB=0) needs to be applied to the inverted sleep terminal.

As shown in FIG. 3, the reset signal RT is applied to the reset terminal R of the latch circuit FF1 through the first switch SW1, and the inverted set signal STB is applied to the set terminal SB of the latch circuit FF1 through the second switch SW2.

The first switch SW1 serves to selectively apply the reset signal RT to the reset terminal R in response to a data keep signal KP. The switch SW1 is in the form of a break-type switch with respect to the data keep signal KP. Specifically, when the data keep signal LP is in the logic L state (i.e., KP=0), the reset signal RT in the logic H level (i.e., RT=1) is transferred through the first switch SW1 to the reset terminal R of the latch circuit FF1, thereby resetting the circuit FF1 to the specific reset state. On the other hand, when the data keep signal KP is in the logic H state (i.e., KP=1), the reset signal RT in the logic L level (i.e., RT=0) is transferred through the first switch SW1 to the reset terminal R of the latch circuit FF1. Thus, the circuit FF1 is compulsorily placed to a specific non-resettable state.

Similarly, the second switch SW2 serves to selectively apply the inverted set signal STB to the inverted set terminal SB in response to the data keep signal KP. The switch SW2 also is in the form of a break-type switch with respect to the data keep signal KP. Specifically, when the data keep signal KP is in the logic L state (i.e., KP=0), the inverted set signal STB in the logic H level (i.e., STB=1) is transferred through the second switch SW1 to the inverted set terminal SB of the latch circuit FF1, thereby setting the circuit FF1 to the specific set state. On the other hand, when the data keep signal KP is in the logic H state (i.e., KP=1), the inverted set signal STB in the logic L level (i.e., STB=0) is transferred through the second switch SW2 to the inverted set terminal SB of the latch circuit FF1. Thus, the circuit FF1 is compulsorily placed to a specific non-settable state.

Figure 4:
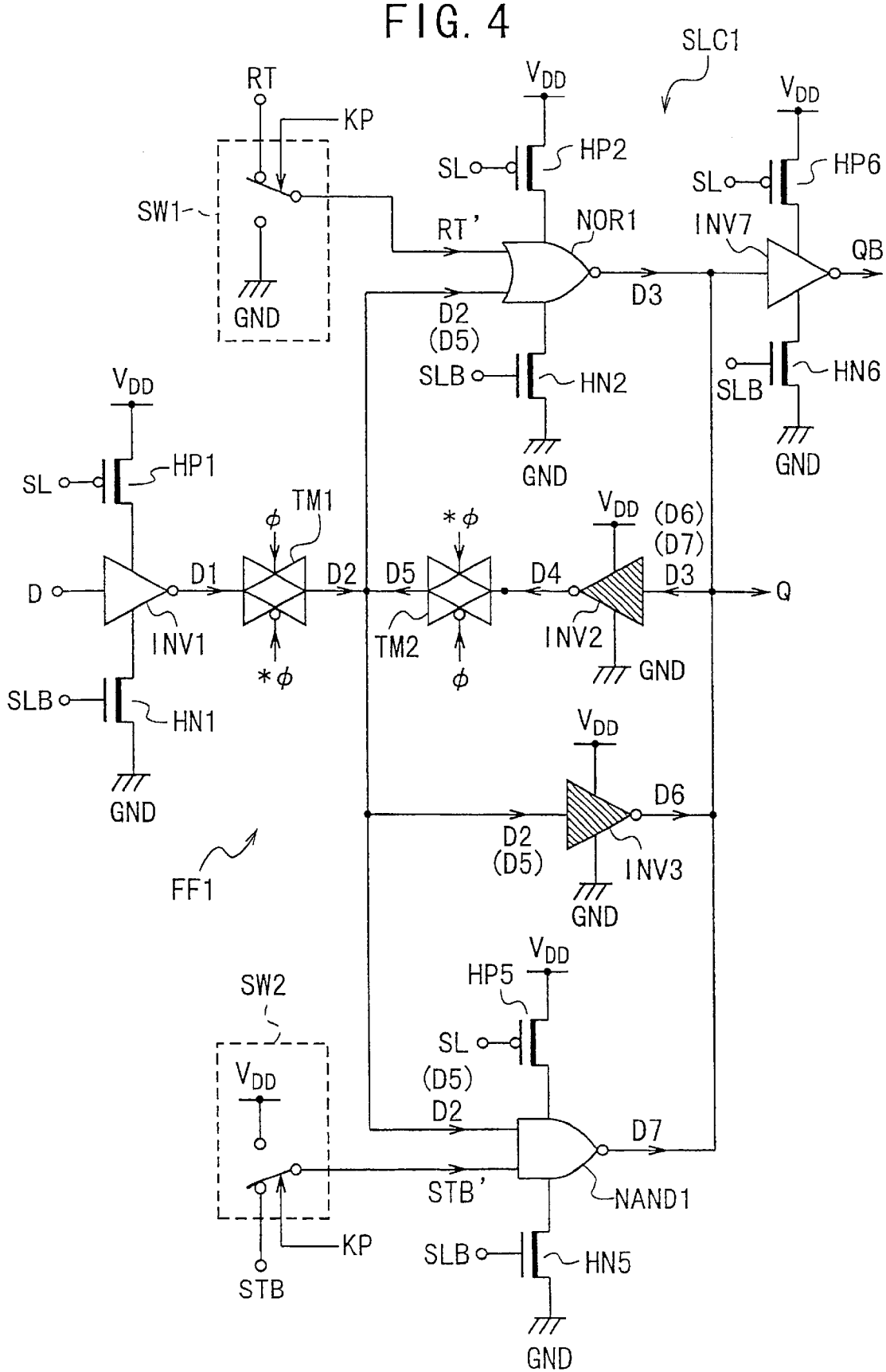
FIG. 4 is a diagram showing the detailed circuit configuration of the sequential logic circuit according to the first embodiment of FIG. 3.

FIG. 4 shows a detailed circuit configuration of the sequential logic circuit SLC1 according to the first embodiment of FIG. 3.

The latch circuit FF1 in FIG. 4 has substantially the same configuration as that of the prior-art latch circuit FF102 shown in FIG. 1, except that a NAND gate NAND1 and an inverter INV7 are added.

Specifically, the latch circuit FF1 includes transmission gates TM1 and TM2, inverters INV1, INV2, INV3, and INV7, a NOR gate NOR1, and a NAND gate NAND1.

The inverter INV1 is formed by low-threshold MOSFETs and therefore, it is capable of high-speed operation. The inverter INV1 is supplied with an upper-side power supply of $V_{DD}$ through a high-threshold p-channel control MOSFET HP1 and a lower-side power supply (i.e., the ground potential GND) through a high-threshold n-channel control MOSFET HN1. An output signal D1 of the inverter INV1 is applied to a bidirectional terminal of the transmission gate TM1.

The high-threshold MOSFET HP1 serves to connect the inverter INV1 to the upper-side power supply of $V_{DD}$ or disconnect the inverter INV1 therefrom in response to a sleep mode signal SL. Similarly, the high-threshold MOSFET HN1 serves to connect the inverter INV101 to the ground GND or disconnect the inverter INV1 therefrom in response to an inverted sleep mode signal SLB. The signal SLB has an inverted value to that of the signal SL.

To enter the sleep mode, the sleep mode signal SL is in the logic H level (i.e., SL=1) and the inverted sleep mode signal SLB is in the logic L level (i.e., SLB=0). At this stage, the control transistors HP1 and HN1 are turned off, blocking the supply of the supply voltage $V_{DD}$ and the ground potential GND to the inverter INV1. Since the control transistors HP1 and HN1 have the high threshold voltages, they have small subthreshold leakage currents, which decreases the power consumption in the sleep mode.

The transmission gate TM1, which is formed by low-threshold MOSFETs, is applied with a clock signal $\phi$ and in inverted clock signal $*\phi$. The signal $*\phi$ has an inverted value to that of the signal $\phi$. One of the bidirectional terminals of the transmission gate TM1 is connected to the output terminal of the inverter INV1 and the other is connected to a second input terminal of the NOR gate NOR1.

The NOR gate NOR1 is formed by low-threshold MOSFETs and therefore, it is capable of high-speed operation. The NOR gate NOR1 is supplied with the upper-side power supply of $V_{DD}$ through a high-threshold p-channel control MOSFET HP2 and with the ground potential GND through a high-threshold n-channel control MOSFET HN2. The high-threshold MOSFET HP2 serves to connect the gate NOR1 to the power supply of $V_{DD}$ or disconnect it therefrom in response to the sleep mode signal SL. Similarly, the high-threshold MOSFET HN2 serves to connect the gate NOR1 to the ground GND or disconnect it therefrom in response to the inverted sleep mode signal SLB.

In the sleep mode where the signal SL is in the logic H level (i.e., SL=1) and the inverted sleep mode signal SLB is in the logic L level (i.e., SLB=0), the control transistors HP2 and HN2 are turned off, blocking the supply of the supply voltage $V_{DD}$ and the ground potential GND to the NOR gate NOR1. Since the control transistors HP2 and HN2 have the high threshold voltages, they have small subthreshold leakage currents, which decreases the power consumption.

The inverter INV2, which is formed by high-threshold MOSFETs, is directly supplied with the power supply of $V_{DD}$ and the ground potential GND. The inverter INV2 is capable of decreasing the power consumption in the sleep mode.

The transmission gate TM2 is formed by low-threshold MOSFETs. The gate TM2 has substantially the same configuration as that of the transmission gate TM1 except that the inverted clock signal $*\phi$ and the clock signal $\phi$ are applied thereto.

The NAND gate NAND1 is formed by low-threshold MOSFETs and therefore, it is capable of high-speed operation. The NAND gate NAND1 is supplied with the upper-side power supply of $V_{DD}$ through a high-threshold p-channel control MOSFET HP5 and with the ground potential GND through a high-threshold n-channel control MOSFET HN5. The high-threshold MOSFET HP5 serves to connect the gate NAND1 to the power supply of $V_{DD}$ or disconnect it therefrom in response to the sleep mode signal SL. Similarly, the high-threshold MOSFET HN5 serves to connect the gate NAND1 to the ground GND or disconnect it therefrom in response to the inverted sleep mode signal SLB.

The inverter INV7 is formed by low-threshold MOSFETs and therefore, it is capable of high-speed operation. The inverter INV7 is supplied with the upper-side power supply of $V_{DD}$ through a high-threshold p-channel control MOSFET HP6 and the ground potential GND through a high-threshold n-channel control MOSFET HN6. An output signal of the inverter INV7 is an inverted output signal QB of the latch circuit FF1.

The high-threshold MOSFET HP6 serves to connect the inverter INV7 to the upper-side power supply of $V_{DD}$ or disconnect it therefrom in response to a sleep mode signal SL. Similarly, the high-threshold MOSFET HN6 serves to connect the inverter INV7 to the ground GND or disconnect it therefrom in response to an inverted sleep mode signal SLB.

Next, the operation of the sequential logic circuit SLC1 according to the first embodiment is explained below with reference to FIGS. 5A to 5G and FIGS. 6A to 6G.

The latch circuit FF1 enters the "active mode" when the sleep mode signal SL is in the logic L level (i.e., SL=0) and the inverted sleep mode signal SLB is in the logic H level (i.e., SLB=1). In this mode, the control transistors HP1, HN1, HP2, HN2, HP5, HN5, HP6, and HN6 are turned on, allowing the supply voltage $V_{DD}$ and the ground potential GND to be supplied to the inverters INV1 and INV7, the NOR gate NOR1, and the NAND gate NAND1. Therefore, the inverter INV1 is capable of its inverting operation with respect to the data signal D, the inverter INV7 is capable of its inverting operation with respect to the output signal Q, the gate NOR1 is capable of its NOR operation with respect to the output signal D2 of the transmission gate TM1, and the gate NAND1 is capable of its NAND operation with respect to the output signal D2 of the transmission gate TM1.

When the reset signal RT, which is applied to the latch FF1 through the first switch SW1, is in the logic L level (i.e., RT=0), the latch circuit FF1 is not reset and capable of its high-speed latch operation. In this state, the output signal D1 of the inverter INV1 is introduced by the opened transmission gate TM1 at the time t1 when the pulse of the clock signal φ is rising (i.e., the pulse of the inverted clock signal ★φ is falling) and then, the signal D1 is transmitted to the NOR gate NOR1, the inverter INV3, and the NAND gate NAND1. At this time t1, as shown in FIG. 5C, the clock signal φ is turned from the latch mode to the through mode. After a latch release time tPD1 is passed (see FIG. 5A), the inverter INV3 outputs the output signal D3' as the output signal Q of the latch circuit FF1 at the time t2.

At this stage, the transmission gate TM2 is closed at the time t1 by the inverted clock signal ★φ. Therefore, the output signal D2 of the inverter INV1 and the output signal D4 of the inverter INV2 do not become competitive.

If the logic state of the data signal D is inverted at the time t3 during the through mode of the clock signal φ, as shown in FIG. 5B, the inversion of the signal D appears in the output signal Q at the time t4 delayed by a propagation delay time tPD2 with respect to the time t3, as shown in FIG. 5A. To ensure the normal operation of the latch circuit FF1, the inversion of the signal D is possible under the condition that the inversion time t3 of the clock signal φ is prior to the inversion time t4 of the data signal D by at least a set-up time tDS. Also, the inverted data signal D needs to be held by the time t5 delayed by a data hold time tDH with respect to the time t4, as shown in FIG. 5B.

Then, the data signal D2 introduced by the transmission gate TM1 is inputted into the next-stage inverter INV2 through the NOR gate NOR1 or the NAND gate NAND1 and the inverter INV3. Furthermore, the data signal D4 is introduced by the transmission gate TM2 at the time t4 and then, it is fed back to the second input terminals of the NOR gate NOR1 and the NAND gate NAND1 and the input of the inverter INV3.

At this stage, the transmission gate TM1 is closed at the time t4 and therefore, the output signal D5 of the transmission gate TM2 and the output signal D2 of the inverter INV2 do not become competitive.

If the reset signal RT in the logic H level (i.e., RT=1) is applied to the latch circuit FF1 during the active mode (i.e., SL=0 and SLB=1), the output signal Q is forced to be turned to the logic L level (i.e., Q=0) independent of the state of the clock signal φ and the inverted clock signal ★φ. Thus, the reset operation of the latch circuit FF1 is carried out.

The same description is applied to the inverted set signal STB applied to the latch FF1 through the second switch SW2. Therefore, the explanation about the inverted set signal STB is omitted here.

Next, the operation of the latch circuit FF1 in the sleep mode is explained below with reference to FIGS. 5A to 5G.

The latch circuit FF1 enters the sleep mode when the sleep mode signal SL is in the logic H level (i.e., SL=1) and the inverted sleep mode signal SLB is in the logic L level (i.e., SLB=0). In this mode, the control transistors HP1, HN1, HP2, HN2, HP5, HN5, HP6, and HN6 are turned off, blocking the supply of the power supply voltage $V_{DD}$ and the ground potential GND to the inverters INV1 and INV7, the NOR gate NOR1, and the NAND gate NAND1. Therefore, the inverters INV1 and INV7 are unable to perform their inverting operations with respect to the data signal D and output signal Q, and at the same time, the gate NOR1 and NAND1 are unable to perform their NOR and NAND operations with respect to the output signal D2 of the transmission gate TM1.

The operation of the latch circuit FF1 in the sleep mode is explained in detail below.

Here, prior to the transition from the active mode (i.e., SL=0 and SLB=1) to the sleep mode (i.e., SL=1 and SLB=0), it is assumed that the clock signal φ is fixed in the logic L level (i.e., φ=0) and the inverted clock signal ★φ is fixed in the logic H level (i.e., ★φ=1). Also, it is assumed that the clock signal φ in the logic L level and the inverted clock signal ★φ in the logic H level are kept unchanged in the sleep mode. This is to ensure the latch operation of the circuit FF1. Specifically, the inverters INV2 and INV3, which are connected to each other through the transmission gate TM2, constitute a bistable circuit. Therefore, the inputted data to the latch circuit FF1 immediately before the transition to the sleep mode can be latched by the bistable circuit.

To ensure the latch operation in the sleep mode, it is needless to say that the power supply voltage $V_{DD}$ and the ground potential GND are kept being supplied to the inverters INV2 and INV3 even in the sleep mode. Since the inverters INV2 and INV3 are formed by the high-threshold MOSFETs, current leakage is small in the sleep mode, resulting in low power consumption of the inverters INV2 and INV3. On the other hand, the supply of the power supply voltage $V_{DD}$ and the ground potential GND to the inverter INV1, the NOR gate NOR1, and the NAND gate NAND1 is stopped and at the same time, the control MOSFETs HP1, HN1, HP2, HN2, HP5, HN5, HP6, and HN6 have the high threshold voltage. Thus, current leakage is small in the sleep mode, resulting in low power consumption of the MOSFETs HP1, HN1, HP2, HN2, HP5, HN5, HP6, and HN6.

Next, the conditions for satisfying the above-described assumption that the clock signal φ is fixed in the logic L level (i.e., φ=0) and the inverted clock signal ★φ is fixed in the logic H level (i.e., *φ=1) and that the clock signal φ in the logic L level and the inverted clock signal *φ in the logic H level are kept unchanged in the sleep mode are explained below.

When the operation of the latch circuit FF1 is turned from the active mode to the sleep mode, the logic state (L or H) of the data signal D needs to be held at the time t5 subsequent to the time t4 when the circuit FF1 is turned to the latch mode by at least the data hold time tDH.

On the other hand, if the latch circuit FF1 is incorporated into a semiconductor integrated logic circuit including sequential logic circuits similar to the circuit FF1 and combinatorial logic circuits, the necessary time for the data hold times to be passed in all the sequential logic circuits including the latch circuit FF1 is longer than the data hold time tDH due to the different propagation delays of signals.

Then, when the data keep signal KP is in the logic L state (i.e., KP=0), the latch circuit FF1 is in its normal mode. On the other hand, when the data keep signal KP is in the logic H state (i.e., KP=1), the latch circuit FF1 is in its data keep mode. According to the transition of the data keep signal KP from the logic L state to the logic H state at the time t6, the circuit FF1 is turned from the normal mode to the data keep mode. The time t6 is delayed from the time t5 by a release time tRL1. The time t5 is delayed by the data hold time tDH with respect to the time t4 at which the clock signal φ is turned from the logic H level to the logic L level. As a result, the ground potential GND (i.e., RT=0) is applied to the reset terminal R through the first switch SW1, thereby causing the circuit FF1 to be in the non-resettable state. In other words, since the circuit FF1 is not affected by the logic state of the reset signal RT in the data keep mode, there is no possibility that the circuit FF1 is reset due to unexpected noises.

Then, at the time t7 delayed by a release time tRL2 with respect to the time t6 when the data keep signal KP is turned from the logic L state to the logic H state, the latch circuit FF1 is turned from the active mode to the sleep mode. This is caused by the transition of the sleep signal SL and the inverted sleep signal SLB at the time t7.

Additionally, at the time t8 after a data calm time tDC from the time t7, the data signal D is turned to be in a floating or undefined state. Similarly, at the time t8 after a reset calm time tRC from the time t7, the reset signal RT is also turned to be in a floating or undefined state. The floating or undefined states of the signals D and RT are maintained through the sleep mode. Also, to keep the stored data in the latch circuit FF1 through the sleep mode, in other words, to keep the bistable circuit formed by the inverters INV2 and INV3 active, the transmission gate TM2 needs to be kept open (i.e., ON). Therefore, the clock signal φ in the logic L level and the inverted clock signal *φ in the logic H level are required to be kept unchanged. Moreover, the stored value of the output signal Q of the latch circuit FF1 in the sleep mode is kept unchanged because the inverter INV3 is kept active. Needless to say, to maintain the circuit FF1 in the non-resettable state, the data keep signal KP is kept in the logic H level (i.e., KP=1) through the sleep mode.

Next, the transition or return from the sleep mode to the active mode after the sleep mode has been held for a specific time period is explained below.

To return the operation of the latch circuit FF1 from the sleep mode to the active mode, the logic state of the sleep signal SL is turned from the H level to the L level at the time t9. At this stage, the logic state (L or H) of the data signal D is returned to the prior state (i.e., D=0) just before entering the sleep mode at the time t10. The time t10 is delayed from the time t9 by a data recovery time tDB. Similarly, the logic state (L or H) of the reset signal RT is returned to the prior state (RT=0) just before entering the sleep mode at the time t10. The time t10 is delayed from the time t9 by a reset recovery time tRB.

On the other hand, as already described above, if the latch circuit FF1 is incorporated into a semiconductor integrated logic circuit including sequential logic circuits similar to the circuit FF1 and combinatorial logic circuits, the necessary time for the data and reset recovery times to be passed in all the sequential logic circuits including the latch circuit FF1 is longer than the data recovery time tDB and the reset recovery time tRB due to the different propagation delays of signals.

Considering this fact, the transition of the data and reset signals D and RT is performed at the time t11 after a removal time tRM0 is passed from the time t10. This is due to the transition of the data keep signal KP from the logic H level (KP=1) to the logic L level (KP=0). As a result, even in the active mode (i.e., S1=0 and SLB=1), the reset signal RT becomes able to be applied to the reset terminal R of the latch circuit FF1 through the first switch SW1.

At this stage, according to the instruction to return from the sleep mode to the active mode, the latch circuit FF1 can operate its latch operation without breaking or losing the latched information or data, reproducing the stored information correctly.

At the time t12 subsequent to the time t11 at which the data keep signal KP is turned from the H level to the L level by a set-up time tDS, the circuit FF1 becomes able to operate its latch operation, in other words, the circuit FF1 becomes practically active.

Needless to say, the fact that the data signal D can be shifted from the time t12 prior to the time t13 by a setup time tDS should be considered.

Figure 5E:
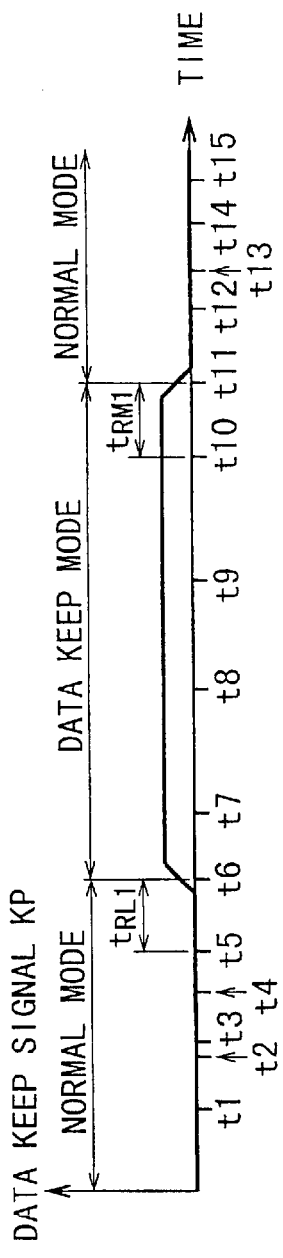
Figure 5F:
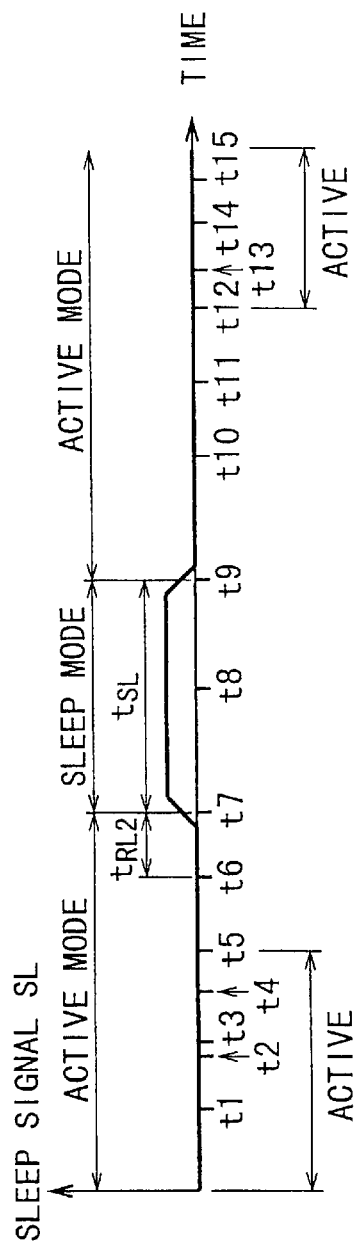
Figure 5G:
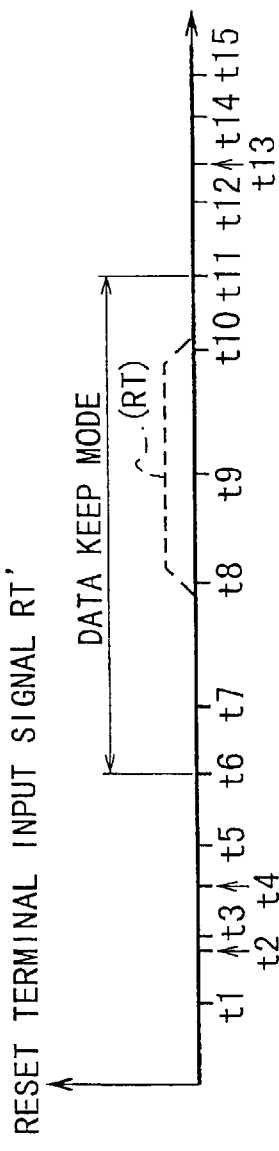

FIG. 5G shows the timing chart of the reset terminal input signal RT'. As seen from FIG. 5G, the signal RT' is kept in the logic L state not only in the normal mode but also in the data keep mode.

FIGS. 6A to 6G are timing diagrams showing the change of the individual signals used in the sequential logic circuit according to the first embodiment of FIG. 3, respectively.

As explained above, the necessary times such as the release time tRL1 and the removal time tRM2 are defined with respect to the clock signal φ (and the inverted clock signal *φ) in FIGS. 5A to 5G. Unlike this, the necessary times such as a release time tRL3 and a removal time tRM3 are defined with respect to the reset signal RT and the data keep signal KP in FIGS. 6A to 6G.

Specifically, the latch circuit FF1 is turned from the through mode (i.e., φ=0) to the latch mode (i.e., φ=1) at the time t4. The time t5 is delayed from the time t4 by a hold time tRH. The time t6 is delayed from the time t5 by a release time tRL3. At the time t6, the circuit FF1 is turned from the normal mode (KP=0) to the data keep mode (KP=1).

The switch circuit SW1 is turned from the data keep mode (KP=1) to the normal mode (KP=0) at the time t11. At the time t12 delayed from the time t11 by a release time tRL3, the reset signal RT is turned from the non-resettable mode (RT=0) to the resettable mode (RT=1).

Since the other times such as the set-up time tDS are the same as those in FIGS. 5A to 5G, the explanation about these times is omitted here.

Figure 6A:
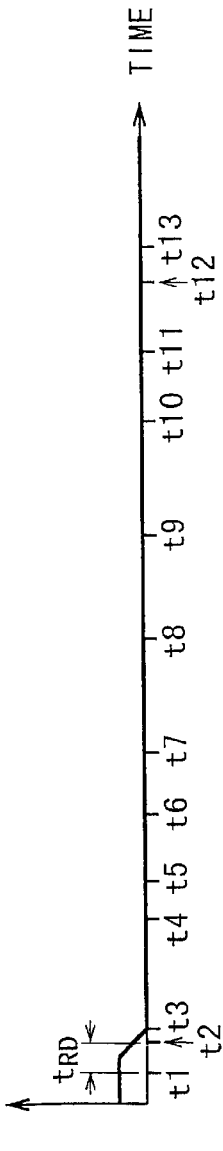
FIGS. 6A to 6G are timing diagrams showing the change of the individual signals used in the sequential logic circuit according to the first embodiment of FIG. 3, respectively.
Figure 6B:
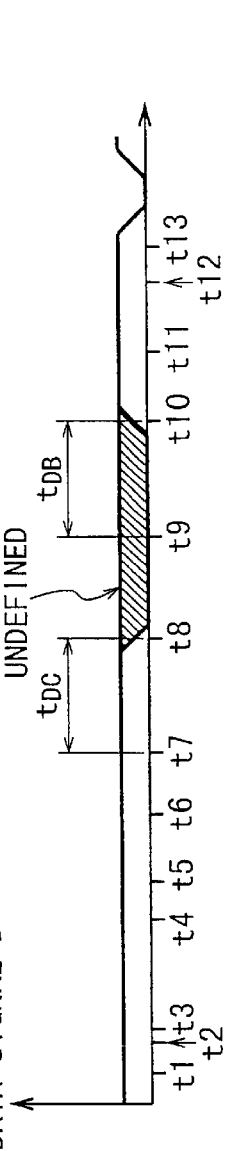
Figure 6C:
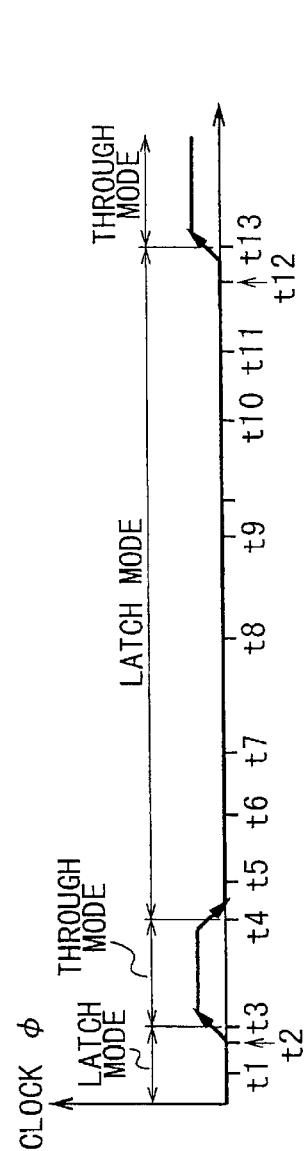
Figure 6D:
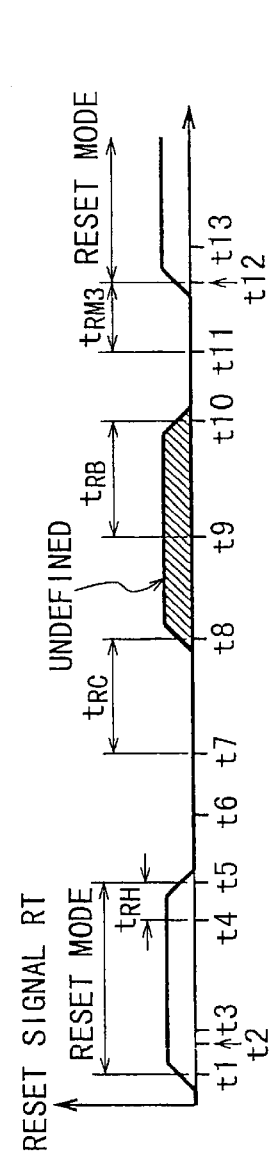
Figure 6E:
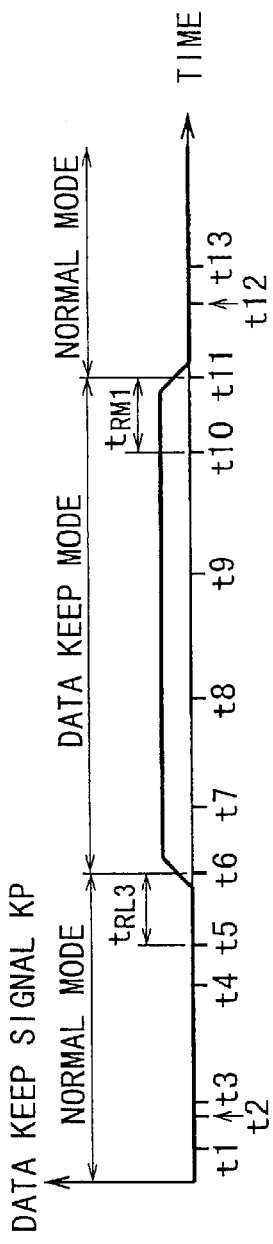
Figure 6F:
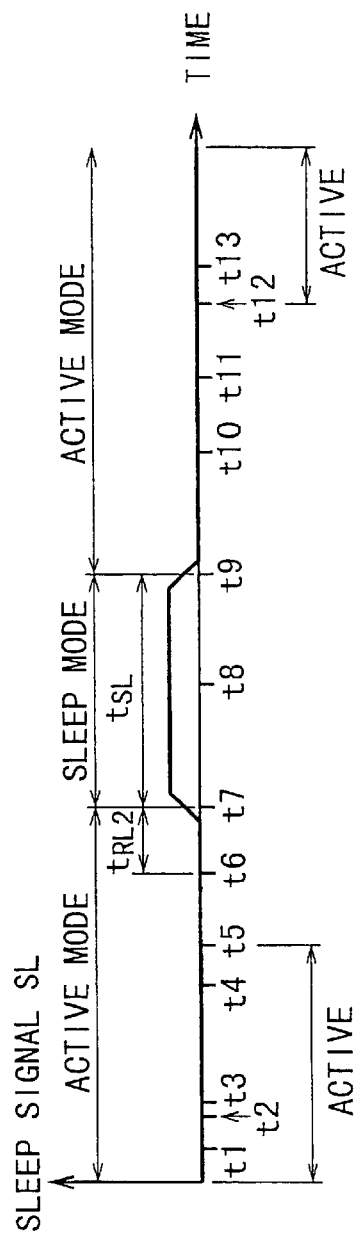
Figure 6G:
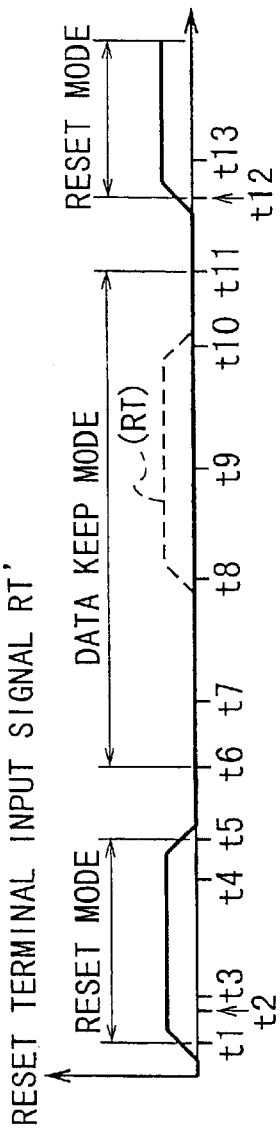

Additionally, "tSL" in FIGS. 5F and 6F denotes the ON time of the sleep signal SL (i.e., the time period of the sleep mode).

SECOND EMBODIMENT

Figure 7:
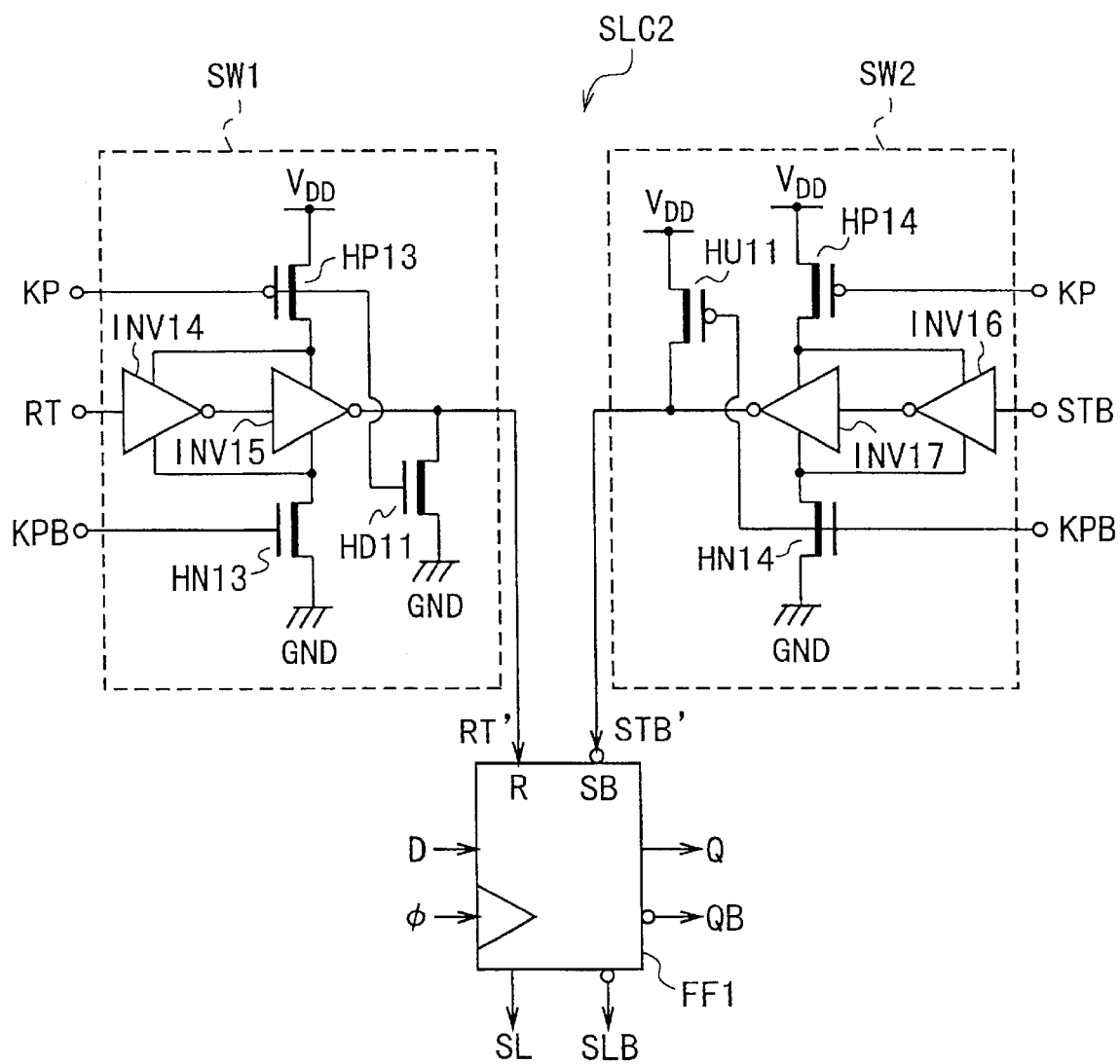
FIG. 7 is a schematic diagram showing the circuit configuration of a sequential logic circuit having sleep and active modes according to a second embodiment of the present invention.

FIG. 7 shows the circuit configuration of a sequential logic circuit SLC2 having sleep and active modes according to a second embodiment of the present invention. The circuit SLC2 has the same configuration as that of the circuit SLC1 according to the first embodiment of FIGS. 3 and 4, except that the first and second switches SW1 and SW2 are illustrated in detail. Thus, only the explanation about the switches SW1 and SW2 is given below.

This first switch SW1 is comprised of two inverters INV14 and INV15 and three control transistors HP13, HN13, and HD11.

The inverter INV14 has a low-threshold p-channel MOSFET (not shown) and a low-threshold n-channel MOSFET (not shown). The gates of these two MOSFETs are coupled together to be connected to an input terminal of the inverter INV14 to which the reset signal RT is applied. The drains of these two MOSFETs are coupled together to be connected to an output terminal of the inverter INV14. The source of the p-channel MOSFET is connected to the upper-side power supply of $V_{DD}$ through the high-threshold p-channel control MOSFET HP13. The source of the n-channel MOSFET is connected to the ground potential GND through the high-threshold n-channel control MOSFET HN13. The output signal of the inverter INV14 is applied to an input terminal of the inverter INV15.

Similarly, the inverter INV15 has a low-threshold p-channel MOSFET (not shown) and a low-threshold n-channel MOSFET (not shown). The gates of these two MOSFETs are coupled together to be connected to the input terminal of the inverter INV15. The drains of these two MOSFETs are coupled together to be connected to the reset terminal R of the latch circuit FF1 as the output signal of the switch SW1. The source of the p-channel MOSFET is connected to the upper-side power supply of $V_{DD}$ through the high-threshold p-channel control MOSFET HP13. The source of the n-channel MOSFET is connected to the ground potential GND through the high-threshold n-channel control MOSFET HN13.

The high-threshold MOSFET HP13 serves to connect the inverters INV14 and INV15 to the upper-side power supply of $V_{DD}$ or disconnect them therefrom in response to the data keep signal KP. Similarly, the high-threshold MOSFET HN13 serves to connect the inverters INV14 and INV15 to the ground GND or disconnect them therefrom in response to the inverted data keep signal KPB.

In the data keep mode where the signal KP is in the logic H level (KP=1) and the KPB signal is in the logic L level (KPB=0), the control MOSFETs HP13 and HN13 are off to thereby block the supply of the power supply voltage $V_{DD}$ and the ground potential GND to the inverters INV14 and INV15. Also, since the control transistors HP13 and HN13 are high-threshold MOSFETs, they have small subthreshold currents, which lowers the poser consumption due to current leakage. Moreover, the pull-down control transistor HD11 is on. Therefore, the output signal of the switch circuit SW1 is fixed at the logic L state (i.e., SW1=0).

On the other hand, in the normal mode where the signal KP is in the logic L level and the KPB signal is in the logic H level, the pull-down control transistor HD11 is off. Therefore, the output signal of the switch circuit SW1 is fixed at the high-impedance state (i.e., SW1=1), separating the switch SW1 from the circuit FF1. Since the control transistor HD11 is a high-threshold MOSFET, it has a small subthreshold current, which lowers the poser consumption due to current leakage.

In the normal mode (KP=0 and KPB=1), the control MOSFETs HP13 and HN13 are in the on state to allow the supply of the power supply voltage $V_{DD}$ and the ground potential GND to the inverters INV14 and INV15. Also, since the inverters INV14 and INV15 are formed by the low-threshold MOSFETs, they are capable of high-speed transmission of the reset signal RT as the output of the switch SW1.

The operation of the switch SW2 is substantially the same as that of the switch SW1.

Specifically, this second switch SW2 is comprised of two inverters INV16 and INV17 and three control transistors HP14, HN14, and HU11.

The inverter INV16 has a low-threshold p-channel MOSFET (not shown) and a low-threshold n-channel MOSFET (not shown). The gates of these two MOSFETs are coupled together to be connected to an input terminal of the inverter INV16 to which the inverted set signal STB is applied. The drains of these two MOSFETs are coupled together to be connected to an output terminal of the inverter INV16. The source of the p-channel MOSFET is connected to the upper-side power supply of $V_{DD}$ through the high-threshold p-channel control MOSFET HP14. The source of the n-channel MOSFET is connected to the ground potential GND through the high-threshold n-channel control MOSFET HN14. The output signal of the inverter INV16 is applied to an input terminal of the inverter INV17.

Similarly, the inverter INV17 has a low-threshold p-channel MOSFET (not shown) and a low-threshold n-channel MOSFET (not shown). The gates of these two MOSFETs are coupled together to be connected to the input terminal of the inverter INV17. The drains of these two MOSFETs are coupled together to be connected to the inverted set terminal SB of the latch circuit FF1 as the output signal of the switch SW2. The source of the p-channel MOSFET is connected to the upper-side power supply of $V_{DD}$ through the high-threshold p-channel control MOSFET HP14. The source of the n-channel MOSFET is connected to the ground potential GND through the high-threshold n-channel control MOSFET HN14.

The high-threshold MOSFET HP14 serves to connect the inverters INV16 and INV17 to the upper-side power supply of $V_{DD}$ or disconnect them therefrom in response to the data keep signal KP. Similarly, the high-threshold MOSFET HN14 serves to connect the inverters INV16 and INV17 to the ground GND or disconnect them therefrom in response to the inverted data keep signal KPB.

In the data keep mode (i.e., KP=1 and KPB=0), the control MOSFETs HP14 and HN14 are off to thereby block the supply of the power supply voltage $V_{DD}$ and the ground potential GND to the inverters INV16 and INV17. Also, since the control transistors HP14 and HN14 are high-threshold MOSFETs, they have small subthreshold currents, which lowers the poser consumption due to current leakage. Moreover, the pull-up control transistor HU11 is on. Therefore, the output signal of the switch circuit SW2 is fixed at the logic H state (i.e., SW2=1).

On the other hand, in the normal mode (i.e., KP=0 and KPB=1), the pull-up control transistor HU11 is off. Therefore, the output signal of the switch circuit SW2 is fixed at the high-impedance state (i.e., SW2=1), separating the switch SW2 from the circuit FF1. Since the control transistor HU11 is a high-threshold MOSFET, it has a small subthreshold current, which lowers the poser consumption due to current leakage.

In the normal mode, the control MOSFETs HP14 and HN14 are in the on state to allow the supply of the power supply voltage $V_{DD}$ and the ground potential GND to the inverters INV16 and INV17. Also, since the inverters INV16 and INV17 are formed by the low-threshold MOSFETs, they are capable of high-speed transmission of the inverted set signal STB as the output of the switch SW2.

THIRD EMBODIMENT

Figure 8:
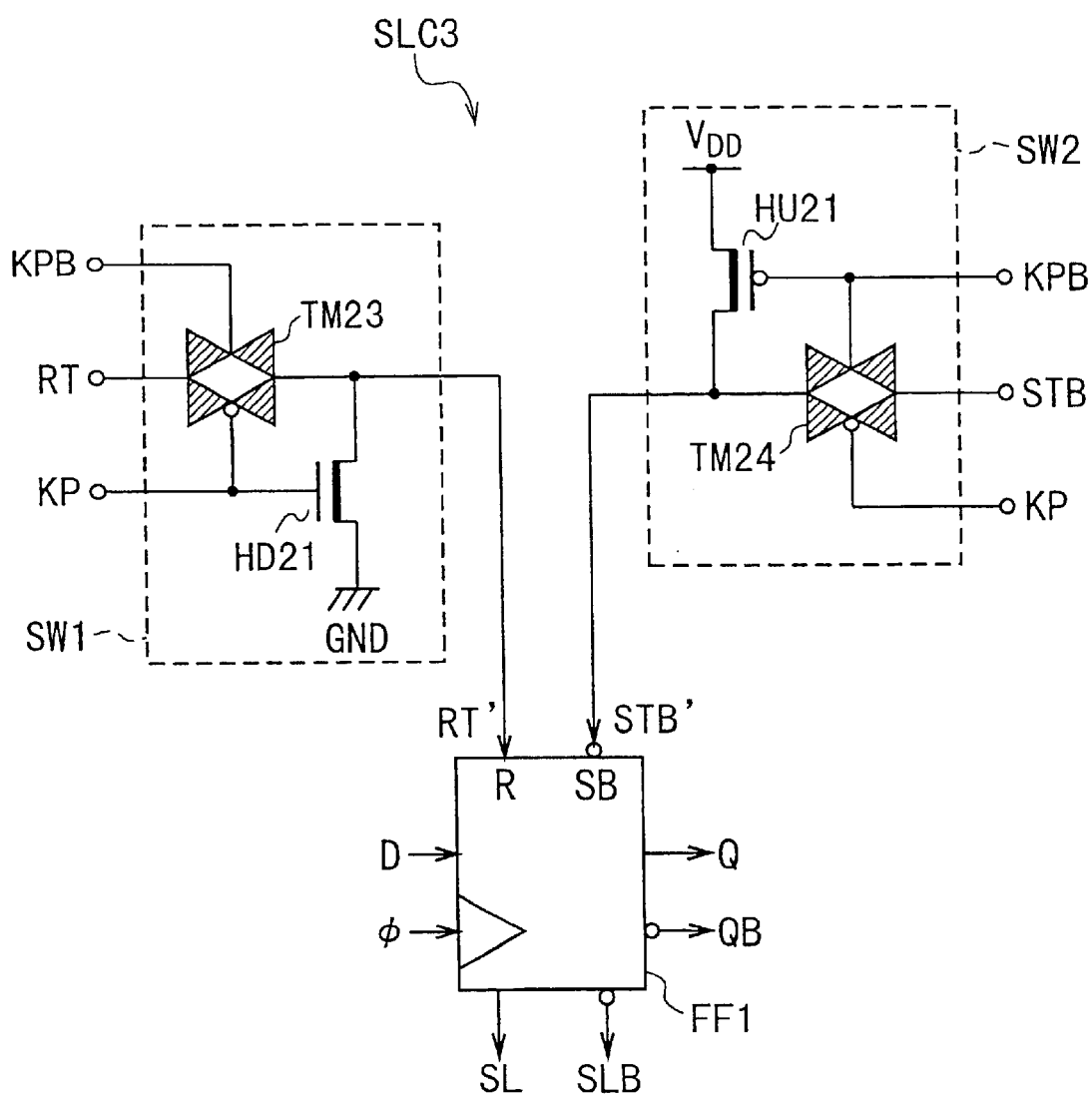
FIG. 8 is a schematic diagram showing the circuit configuration of a sequential logic circuit having sleep and active modes according to a third embodiment of the present invention.

FIG. 8 shows the circuit configuration of a sequential logic circuit SLC3 having sleep and active modes according to a third embodiment of the present invention. The circuit SLC3 has the same configuration as that of the circuit SLC2 according to the second embodiment of FIG. 7, except for the configuration of the first and second switches SW1 and SW2. Thus, only the explanation about the switches SW1 and SW2 is given below.

The first switch SW1 is comprised of a transmission gate TM23 and a control transistor HD21. The transmission gate TM23 is formed by high-threshold MOSFETs. The transmission gate TM23 serves to pass or block the reset signal RT in response to the data keep signal KP and the inverted data keep signal KPB. The transmission gate TM23 blocks the reset signal RT in the data keep mode (i.e., KP=1 and KPB=0), and passes the reset signal RT in the normal mode (i.e., KP=0 and KPB=1).

In the data keep mode, since the pull-down control transistor HD21 is on, the output signal of the switch circuit SW1 is fixed at the logic L state (i.e., SW1=0). On the other hand, in the normal mode, the pull-down control transistor HD21 is off. Therefore, the output signal of the switch circuit SW1 is fixed at the high-impedance state (i.e., SW1=1), separating the switch SW1 from the circuit FF1. Since the control transistor HD21 is a high-threshold MOSFET, it has a small subthreshold current, which lowers the poser consumption due to current leakage.

The second switch SW2 is comprised of a transmission gate TM24 and a control transistor HU21. The transmission gate TM24 is formed by high-threshold MOSFETs. The transmission gate TM24 serves to pass or block the inverted set signal STB in response to the data keep signal KP and the inverted data keep signal KPB. The transmission gate TM24 blocks the inverted set signal STB in the data keep mode (i.e., KP=1 and KPB=0), and passes the inverted set signal STB in the normal mode (i.e., KP=0 and KPB=1).

In the data keep mode, since the pull-up control transistor HU21 is one, the output signal of the switch circuit SW2 is fixed at the logic L state (i.e., SW2=1). On the other hand, in the normal mode, the pull-up control transistor HU21 is off. Therefore, the output signal of the switch circuit SW2 is fixed at the high-impedance state (i.e., SW2=1), separating the switch SW2 from the circuit FF1. Since the control transistor HU21 is a high-threshold MOSFET, it has a small subthreshold current, which lowers the poser consumption due to current leakage.

FOURTH EMBODIMENT

Figure 9:
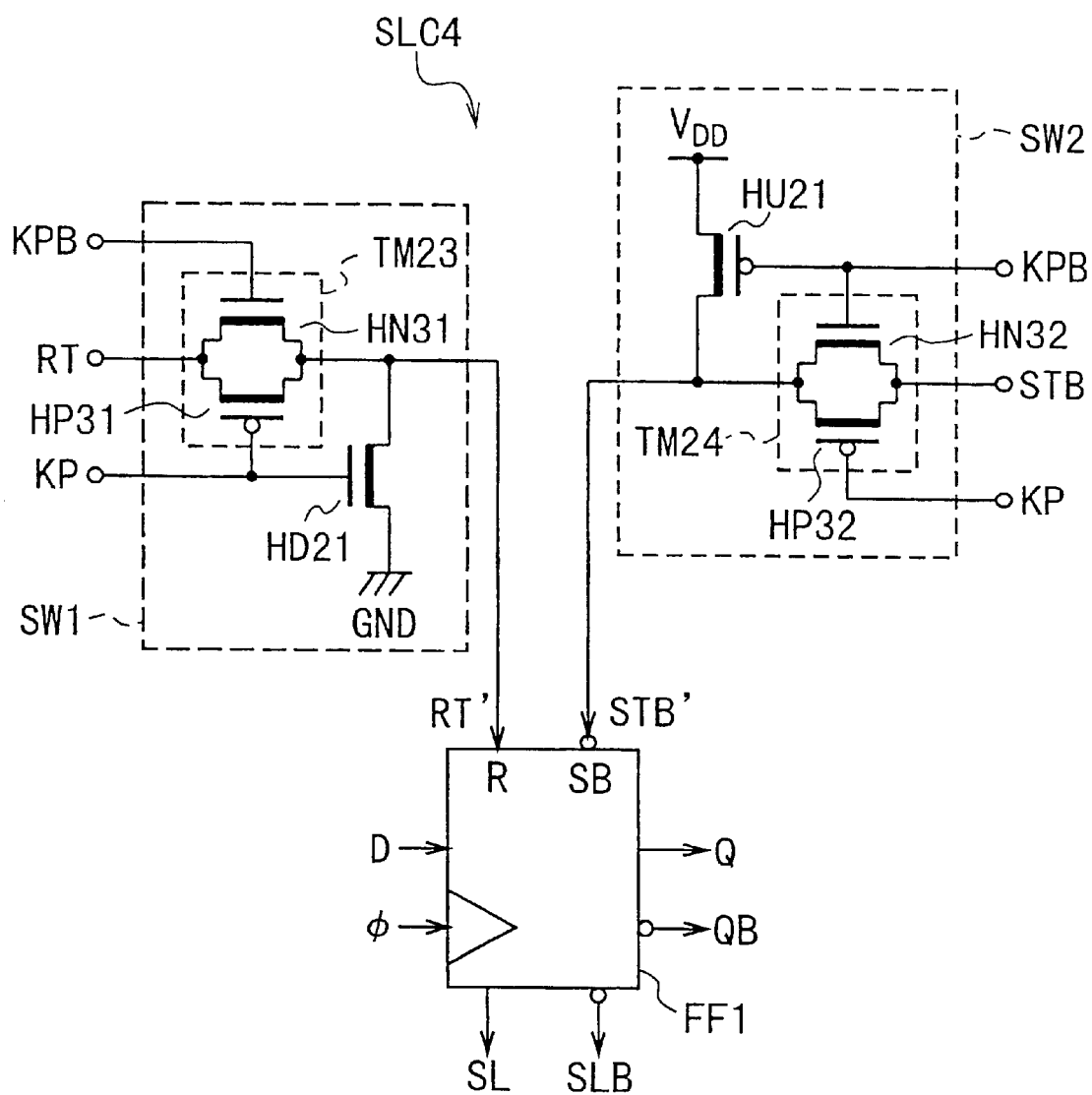
FIG. 9 is a schematic diagram showing the circuit configuration of a sequential logic circuit having sleep and active modes according to a fourth embodiment of the present invention.

FIG. 9 shows the circuit configuration of a sequential logic circuit SLC4 having sleep and active modes according to a fourth embodiment of the present invention. The circuit SLC4 has the same configuration as that of the circuit SLC3 according to the third embodiment of FIG. 8, except that the configuration of the first and second switches SW1 and SW2 are illustrated in detail. Thus, only the explanation about the switches SW1 and SW2 is given below.

The transmission gate TM23 is comprised of a high-threshold p-channel MOSFET HP31 and a high-threshold n-channel MOSFET HN31. The source and drain of the n-channel MOSFET HN31 are connected to drain and source of the p-channel MOSFET HP31, respectively, forming a pair of bidirectional terminals. One of the bidirectional terminals, which forms an input terminal of the switch SW1, is applied with the reset signal RT. The other of the bidirectional terminals, which forms an output terminal of the switch SW1, is connected to the reset terminal R of the latch circuit FF1. The gate of the n-channel MOSFET HN31 is applied with the inverted data keep signal KPB. The gate of the p-channel MOSFET HP31 is applied with the data keep signal KP.

In the data keep mode (KP=1 and KPB=0), the transmission gate TM23 blocks the reset signal RT. In the normal keep mode (KP=0 and KPB=1), the transmission gate TM23 passes the reset signal RT.

Similarly, the transmission gate TM24 is comprised of a high-threshold p-channel MOSFET HP32 and a high-threshold n-channel MOSFET HN32. The source and drain of the n-channel MOSFET HN32 are connected to drain and source of the p-channel MOSFET HP32, respectively, forming a pair of bidirectional terminals. One of the bidirectional terminals, which forms an input terminal of the switch SW2, is applied with the inverted set signal STB. The other of the bidirectional terminals, which forms an output terminal of the switch SW2, is connected to the inverted set terminal SB of the latch circuit FF1. The gate of the n-channel MOSFET HN32 is applied with the inverted data keep signal KPB. The gate of the p-channel MOSFET HP32 is applied with the data keep signal KP.

In the data keep mode (KP=1 and KPB=0), the transmission gate TM24 blocks the reset signal RT. In the normal keep mode (KP=0 and KPB=1), the transmission gate TM24 passes the reset signal RT.

FIFTH EMBODIMENT

Figure 10:
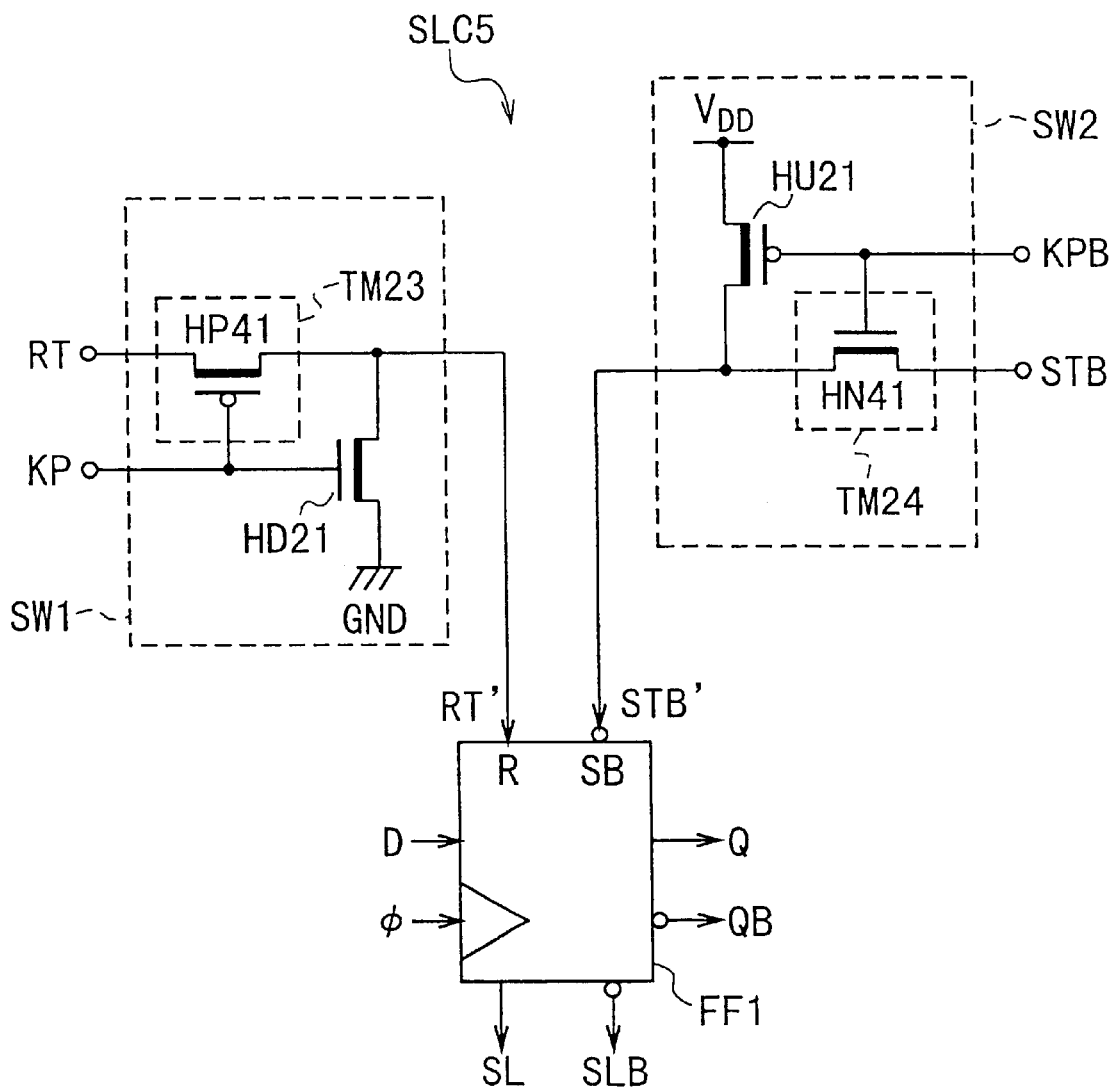
FIG. 10 is a schematic diagram showing the circuit configuration of a sequential logic circuit having sleep and active modes according to a fifth embodiment of the present invention.

FIG. 10 shows the circuit configuration of a sequential logic circuit SLC5 having sleep and active modes according to a fifth embodiment of the present invention. The circuit SLC5 has the same configuration as that of the circuit SLC3 according to the third embodiment of FIG. 8, except that the configuration of the first and second switches SW1 and SW2 are illustrated in detail. The circuit SLC5 is a variation of the circuit SLC3. Thus, only the explanation about the switches SW1 and SW2 is given below.

The transmission gate TM23 is comprised of a high-threshold p-channel MOSFET HP41. The source and drain of the p-channel MOSFET HP41 form a pair of bidirectional terminals. One of the bidirectional terminals, which forms an input terminal of the switch SW1, is applied with the reset signal RT. The other of the bidirectional terminals, which forms an output terminal of the switch SW1, is connected to the reset terminal R of the latch circuit FF1. The gate of the p-channel MOSFET HP41 is applied with the data keep signal KP.

In the data keep mode (KP=1 and KPB=0), the transmission gate TM23 blocks the reset signal RT. In the normal keep mode (KP=0 and KPB=1), the transmission gate TM23 passes the reset signal RT.

Similarly, the transmission gate TM24 is comprised of a high-threshold n-channel MOSFET HN41. The source and drain of the n-channel MOSFET HN41 form a pair of bidirectional terminals. One of the bidirectional terminals, which forms an input terminal of the switch SW2, is applied with the inverted set signal STB. The other of the bidirectional terminals, which forms an output terminal of the switch SW2, is connected to the inverted set terminal SB of the latch circuit FF1. The gate of the n-channel MOSFET HN41 is applied with the inverted data keep signal KPB.

In the data keep mode (KP=1 and KPB=0), the transmission gate TM24 blocks the reset signal STB. In the normal keep mode (KP=0 and KPB=1), the transmission gate TM24 passes the inverted set signal STB.

If the logic L state of the data keep mode signal KP is defined as a specific voltage $V_L$ in the normal mode, the ground potential GND can be applied to the reset terminal R through the switch SW1 even if the reset signal RT is in the logic L state (i.e., RT=0). The specific voltage $V_L$ is given by the equation of $$V_L = 0(=GND) + V_{tp} = 0 - |V_{tp}| = V_{tp}(<0)$$

where $V_{tp}$ is the threshold voltage of the high-threshold p-channel MOSFET HP41.

Similarly, if the logic H state of the inverted data keep mode signal KPB is defined as a specific voltage $V_H$ in the normal mode, the power supply voltage $V_{DD}$ can be applied to the inverted set terminal SB through the switch SW2 even if the inverted set signal STB is in the logic H state (i.e., STB=1). The specific voltage $V_H$ is given by the equation of $$V_H = V_{DD} + V_{tn}(>0)$$

where $V_{tn}$ is the threshold voltage of the high-threshold n-channel MOSFET HN41.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A sequential logic circuit comprising:

a latch circuit having an input terminal to which an input signal is applied, an output terminal from which an output signal is derived, a set terminal to which a set signal is applied, and a reset terminal to which a reset signal is applied;

said latch circuit having an active mode where a latch function is operable and a sleep mode where said latch function is inoperable, one of which is alternatively selected;

said output signal being set to have a specific set state by said set signal having a specific logic level applied to said set terminal in said active mode; and said output signal being reset to have a specific reset state by said reset signal having a specific logic level applied to said reset terminal in said active mode;

wherein said sequential logic circuit includes a means for preventing said set and reset signal from being applied to said set and reset terminal in said sleep mode, respectively, thereby avoiding loss of information latched in said latch circuit prior to transition to said sleep mode from said active mode.

2. The sequential logic circuit as claimed in claim 1, wherein said means has a first switch for passing or blocking said set signal to said latch circuit and a second switch for passing or blocking said reset signal to said latch circuit.

3. The sequential logic circuit as claimed in claim 2, wherein each of said first and second switches has inverters connected in cascade and control transistors for supplying upper- and lower-side supply voltages to said inverters;

and wherein said control transistors are operated by a data keep signal.

4. The sequential logic circuit as claimed in claim 2, wherein each of said first and second switches has a transmission gate operated by a data keep signal.

5. A sequential logic circuit comprising:

a latch circuit having an input terminal to which an input signal is applied, an output terminal from which an output signal is derived, and a set terminal to which a set signal is applied;

said latch circuit having an active mode where a latch function is operable and a sleep mode where said latch function is inoperable, one of which is alternatively selected; and said output signal being set to have a specific set state by said set signal having a specific logic level applied to said set terminal in said active mode;

wherein said sequential logic circuit includes a means for preventing said set signal from being applied to said set terminal in said sleep mode, thereby avoiding loss of information latched in said latch circuit prior to transition to said sleep mode from said active mode.

6. The sequential logic circuit as claimed in claim 5, wherein said means has a switch for passing or blocking said set signal to said latch circuit.

7. The sequential logic circuit as claimed in claim 6, wherein said switch has inverters connected in cascade and control transistors for supplying upper- and lower-side supply voltages to said inverters;

and wherein said control transistors are operated by a data keep signal.

8. The sequential logic circuit as claimed in claim 6, wherein said switch has a transmission gate operated by a data keep signal.

9. A sequential logic circuit comprising:

a latch circuit having an input terminal to which an input signal is applied, an output terminal from which an output signal is derived, and a reset terminal to which a reset signal is applied;

said latch circuit having an active mode where a latch function is operable and a sleep mode where said latch function is inoperable, one of which is alternatively selected; and said output signal being reset to have a specific reset state by said reset signal having a specific logic level applied to said reset terminal in said active mode;

wherein said sequential logic circuit includes a means for preventing said reset signal from being applied to said reset terminal in said sleep mode, thereby avoiding loss of information latched in said latch circuit prior to transition to said sleep mode from said active mode.

10. The sequential logic circuit as claimed in claim 9, wherein said means has a switch for passing or blocking said reset signal to said latch circuit.

11. The sequential logic circuit as claimed in claim 10, wherein said switch has inverters connected in cascade and control transistors for supplying upper- and lower-side supply voltages to said inverters;

and wherein said control transistors are operated by a data keep signal.

12. The sequential logic circuit as claimed in claim 10, wherein said switch has a transmission gate operated by a data keep signal.

* * * * *